(12) United States Patent
Ohsaki et al.

(10) Patent No.: US 7,675,629 B2
(45) Date of Patent: Mar. 9, 2010

(54) EXPOSURE APPARATUS AND DEVICE MANUFACTURING METHOD USING A COMMON PATH INTERFEROMETER TO FORM AN INTERFERENCE PATTERN AND A PROCESSOR TO CALCULATE OPTICAL CHARACTERISTICS OF PROJECTION OPTICS USING THE INTERFERENCE PATTERN

(75) Inventors: Yumiko Ohsaki, Utsunomiya (JP); Yasuhiro Sawada, Tokyo (JP); Kenji Yamazoe, Utsunomiya (JP); Seiji Takeuchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 44 days.

(21) Appl. No.: 11/851,029

(22) Filed: Sep. 6, 2007

(65) Prior Publication Data

US 2008/0062427 A1 Mar. 13, 2008

(30) Foreign Application Priority Data

Sep. 12, 2006 (JP) ............................. 2006-247354
Jul. 4, 2007 (JP) ............................. 2007-176467

(51) Int. Cl.
*G01B 9/02* (2006.01)
(52) U.S. Cl. ...................................... 356/515; 356/495
(58) Field of Classification Search ................. 356/494, 356/517, 520, 521, 495, 515
See application file for complete search history.

(56) References Cited

U.S. PATENT DOCUMENTS

| | | | | |
|---|---|---|---|---|
| 5,789,734 | A | 8/1998 | Torigoe et al. | 250/201.2 |
| 6,788,389 | B2 * | 9/2004 | Fujishima et al. | 355/67 |
| 7,084,977 | B2 | 8/2006 | Nomura | 356/364 |
| 7,106,452 | B2 | 9/2006 | Ouchi | 356/495 |
| 7,304,749 | B2 * | 12/2007 | Ohkubo | 356/521 |
| 2006/0192937 | A1 | 8/2006 | Kerkhof et al. | 355/71 |

FOREIGN PATENT DOCUMENTS

| | | |
|---|---|---|
| JP | 2-116732 | 5/1990 |
| JP | 2002-071515 | 3/2002 |
| JP | 2004-257854 | 9/2004 |
| JP | 2005-116732 | 4/2005 |
| WO | WO03/028073 | 4/2003 |

* cited by examiner

*Primary Examiner*—Hwa (Andrew) S Lee
(74) *Attorney, Agent, or Firm*—Fitzpatrick, Cella, Harper & Scinto

(57) ABSTRACT

An exposure apparatus including an illumination system which illuminates an original, and projection optics which project a pattern of the original illuminated by the illumination system onto a substrate. The apparatus includes an interferometer which forms an interference pattern including aberration information on the projection optics using a polarized light beam emitted from the illumination system, in which the interferometer is a common path interferometer in which two light beams forming interference pattern pass along a path in the projection optics, and a processor which calculates optical characteristics of the projection optics on the basis of the interference pattern formed by the interferometer. The illumination system including a polarization controller which sequentially generates at least three difference polarized light beams with respective polarization states different from each other. The processor separates first aberration and second aberration from wavefront aberration represented by the interference patterns sequentially formed by the interferometer using the at least three different polarized light beams, by calculating a data of the interference patterns, the first aberration being aberration which does not change dependent on a polarization state of polarized light beam entering the projection optics. The second aberration is aberration which changes dependent on the polarization state of the polarized light beam entering the projection optics.

17 Claims, 24 Drawing Sheets

FIG. 5

| | MEASUREMENT RETICLE | MEASUREMENT PATTERN |
|---|---|---|
| (a) | PINHOLE | TWO-DIMENSIONAL DIFFRACTION GRATING |
| (b) | PINHOLE | DIFFRACTION GRATING |
| (c) | SLIT | DIFFRACTION GRATING |

F I G. 10
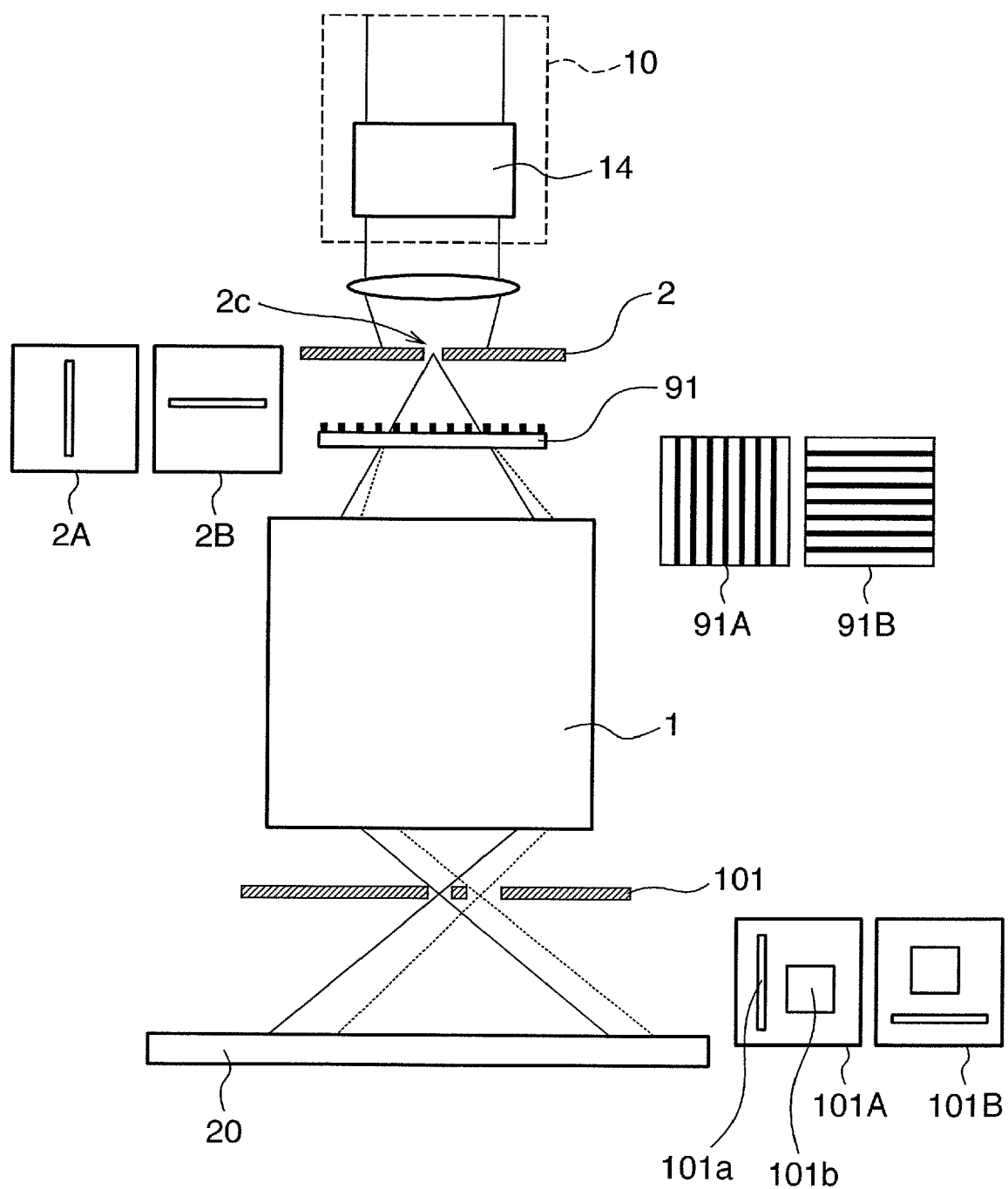

WAFER REFERENCE POSITION

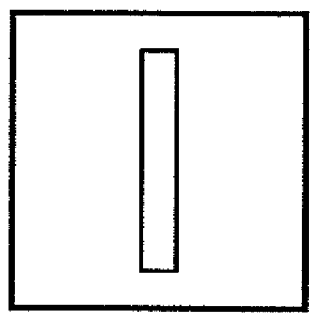
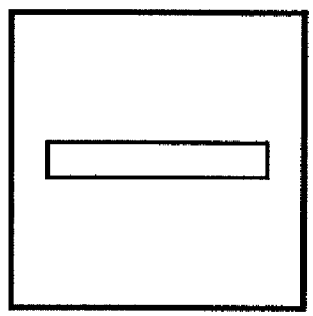
FIG. 16A
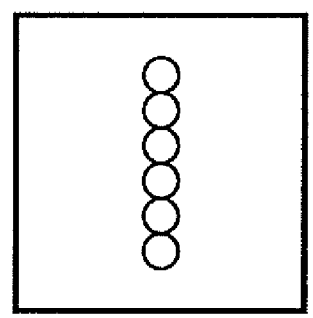
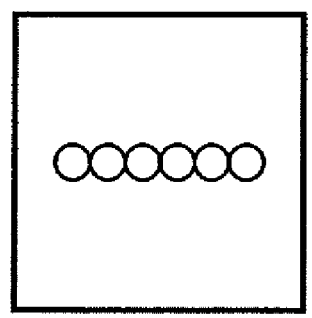
FIG. 16B

F I G. 23
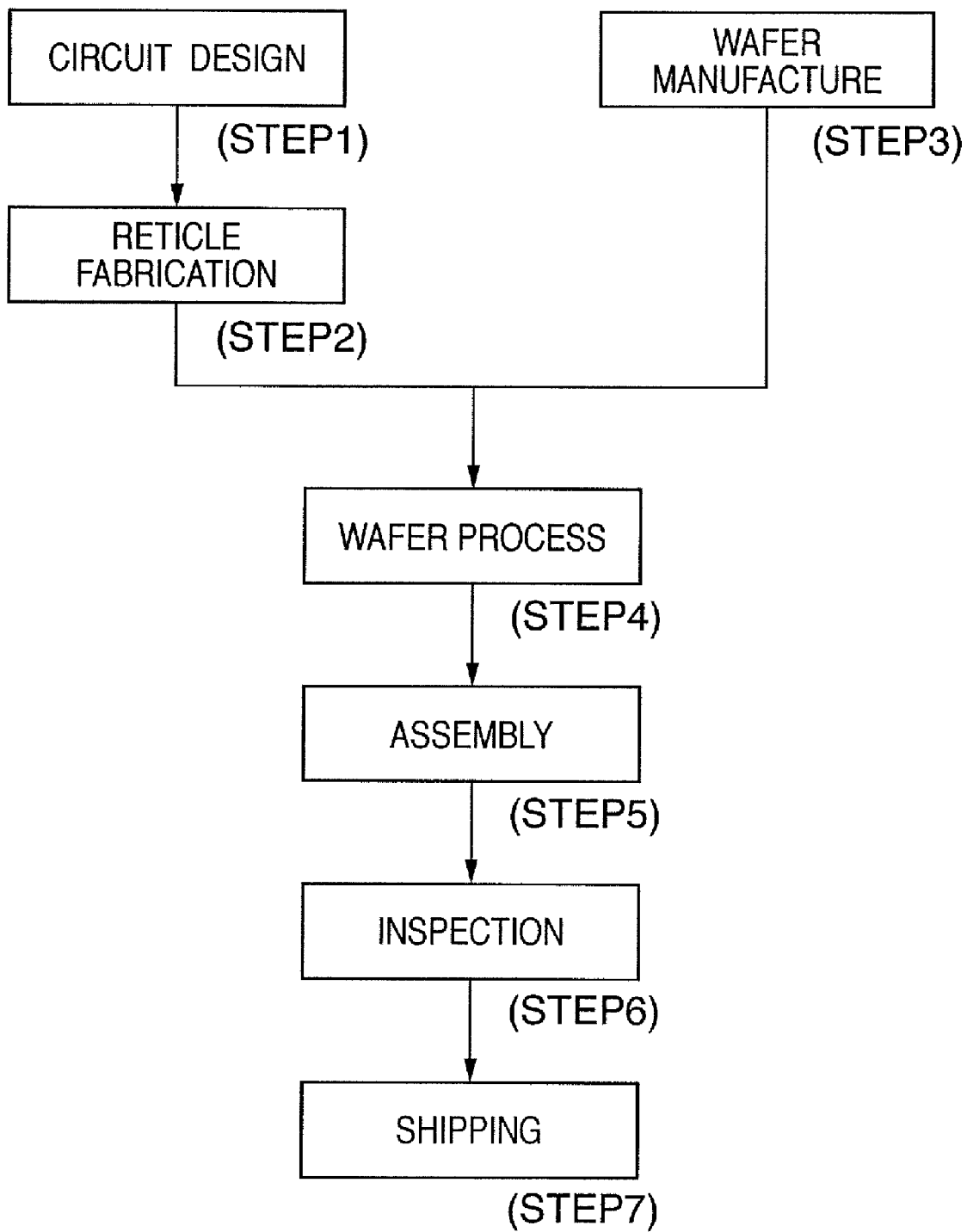

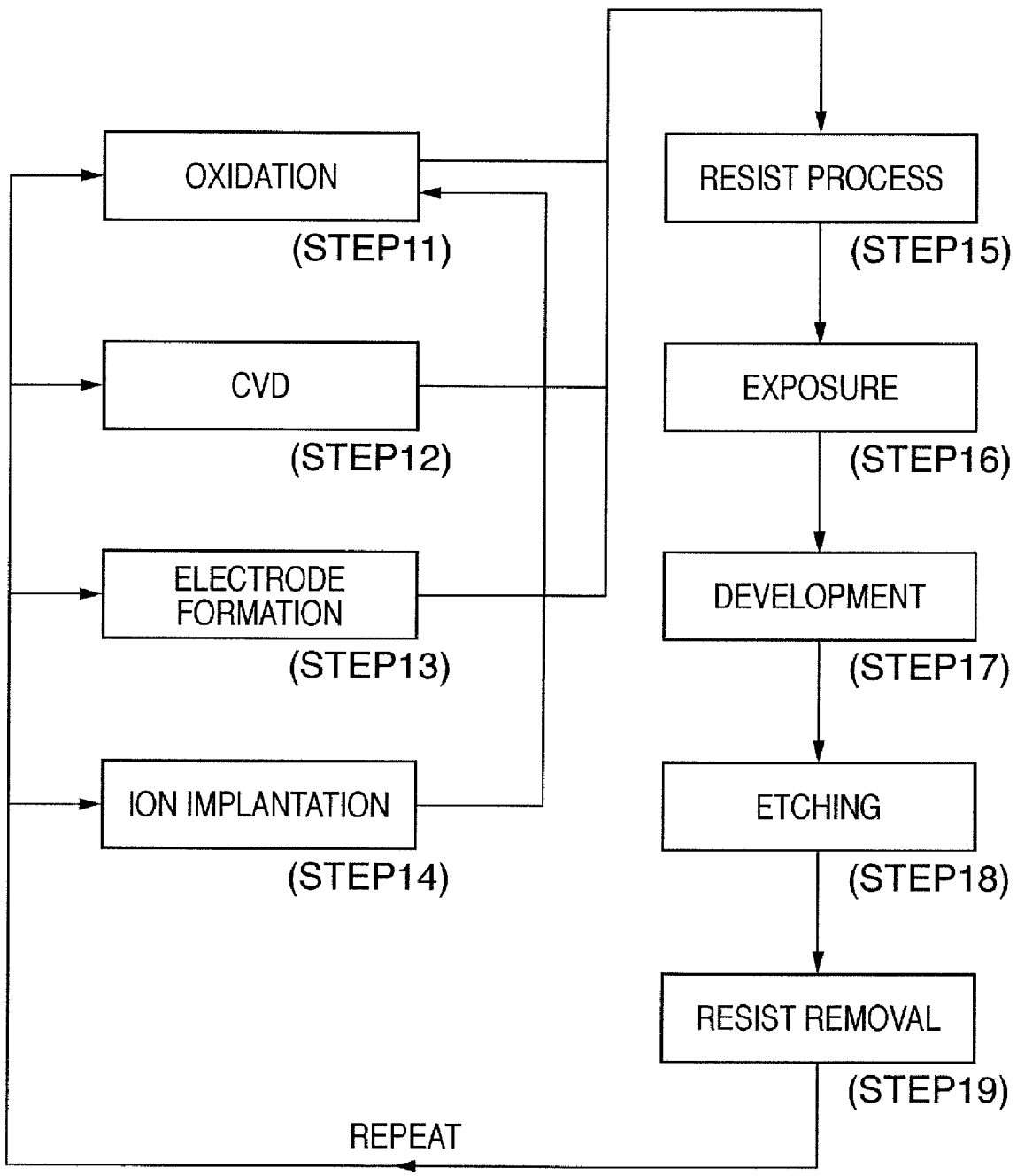

EXPOSURE APPARATUS AND DEVICE MANUFACTURING METHOD USING A COMMON PATH INTERFEROMETER TO FORM AN INTERFERENCE PATTERN AND A PROCESSOR TO CALCULATE OPTICAL CHARACTERISTICS OF PROJECTION OPTICS USING THE INTERFERENCE PATTERN

This application claims the benefit of Japanese Patent Application No. 2006-247354, filed Sep. 12, 2006, and Japanese Patent Application No. 2007-176467, filed Jul. 4, 2007, which are hereby incorporated by reference herein in their entirety.

BACKGROUND OF THE INVENTION

1. Field of the Invention

The present invention relates to an exposure apparatus and a device manufacturing method.

2. Description of the Related Art

In a lithography process to manufacture a device, such as a semiconductor device, an exposure apparatus is used to transfer a pattern on a reticle (original) onto a wafer (substrate) coated with a resist. As the density and degree of integration of integrated circuits increase, the exposure apparatus requires a higher resolution, and, accordingly, the wavelength of the exposure light becomes shorter. More specifically, as a light source for the exposure apparatus, a KrF excimer laser (wavelength: 248 nm) and an ArF excimer laser (193 nm) have been introduced to replace mercury lamps.

An increase in the numerical aperture (NA) of the projection optics of the exposure apparatus can also increase the resolution. Hence, an immersion exposure apparatus is also proposed in which a liquid with a refractive index larger than one fills the space between the projection optics and the wafer, to increase the numerical aperture (NA).

As the resolution of the exposure apparatus increases, strict requirements are imposed on aberration measurement and its correction in the projection optics of the exposure apparatus. For example, it is required to accurately identify and to adjust the influence of a slight change in lens position, which occurs when transporting the exposure apparatus, and changes in optical characteristics caused by heat during an exposure process. Therefore, after mounting the projection optics on an exposure apparatus main body, it is indispensable to measure the optical characteristics of the projection optics in the exposure apparatus and to adjust them to be optimal. The optical characteristics do not depend on polarization, to be described later, but are identical to conventional wavefront aberration, and will, accordingly, be explained as non-polarization aberration hereafter.

As the numerical aperture (NA) increases, the adverse influence of polarization becomes significant. Studies have been made on a method of controlling polarization of the exposure light. However, even by controlling the polarization of the exposure light by using an illumination system to achieve a desired polarization state, the polarization state in the projection optics can change due to distortion caused by holding a lens or by heating of the lens, use of a birefringent material, such as fluorite, and the like. This leads to an increasing demand to accurately identify a change in polarization in the projection optics. Optical characteristics resulting from birefringence of the projection optics depend on polarization of an incident beam and will, accordingly, be explained as polarization aberration hereafter. Polarization aberration includes retardation caused by birefringence, and its azimuth. Other than retardation and azimuth, polarization aberration may be expressed in various manners, e.g., a Stokes parameter, a Jones matrix, and a Mueller matrix.

In this manner, as the performance of the exposure apparatus improves, demands increase to measure, as the optical characteristics of the projection optics, non-polarization aberration, which does not depend on polarization and polarization aberration which does, quickly and accurately.

As a method of measuring the non-polarization aberration and polarization aberration of an optical system, Japanese Patent Laid-Open No. 2002-71515, No. 2004-257854, and No. 2-116732 propose the use of an interferometer dedicated to measurement. PCT Publication No. WO 2003/028073 proposes the use of an aberration measurement unit to measure non-polarization aberration and a polarization converting unit to measure polarization aberration. Japanese Patent Laid-Open No. 2005-116732 proposes a Mueller-matrix measurement method for an exposure apparatus.

However, the above methods include various problems. Japanese Patent Laid-Open No. 2002-71515, No. 2004-257854, and No. 2-116732 propose interferometers dedicated to measurement, which are difficult to apply to measurement in an exposure apparatus main body. This is because any one of the above interferometers is configured to measure the wavefront of a detection target surface by referring to a reference surface, as in a Mach-Zehnder interferometer. More specifically, with the above methods, the optical path is long and complicated, and not a common path, so the adverse influence of vibration is non-negligible. In addition, generally, an exposure light source has a very short coherence length and is, accordingly, unsuited for measurement in an exposure apparatus. Moreover, when mounting an interferometer in an exposure apparatus, an image sensing device, serving as a detector, must be arranged on the stage. Hence, weight factors are also significant.

Namely, to mount an interferometer in the exposure apparatus, the interferometer must enable measurement with lenses, and be resistant to vibration, be compact, light-weight, and accurate. When measurement is to be performed using exposure light from the exposure light source, the interferometer must also be capable of measurement using light with a short coherence length.

Specific problems will be described hereafter. Japanese Patent Laid-Open Nos. 2002-71515 and 2004-257854 propose separate calculations of wavefronts, which depend on polarization, and wavefronts which do not, from the measurement results of two perpendicular polarized light beams. However, from measurement of two perpendicular incident polarized light beams, only a change in wavefront, which depends on polarization, is obtained. It is impossible to measure retardation and azimuth, which are birefringence information of the optical system, simultaneously and accurately. As retardation and azimuth of birefringence must be obtained accurately as aberration caused by polarization, the methods described above are not sufficient for this. Since many of the methods require measurement light having a long coherence length, exposure light cannot be used as measurement light.

Japanese Patent Laid-Open No. 2-116732 uses a Mach-Zehnder interferometer, in which the beam is parallel light. As the optical path is branched to cause interference between a reference wavefront and a detection surface, the interferometer is sensitive to vibration, requiring a long coherence length. It is, therefore, very difficult to form such an interferometer arrangement in the exposure apparatus. Except for that, Japanese Patent Laid-Open No. 2-116732 discloses nothing concerning the interferometer. In addition, at least four linearly polarized light beams are necessary.

PCT Publication No. WO 2003/028073 discloses the use of two linearly polarized light beams for aberration measurement. As described above, with only two linearly polarized light beams, the retardation and azimuth of birefringence cannot be calculated accurately. PCT Publication No. WO 2003/028073 also discloses a method of separately measuring only birefringence by a combination of a wavelength plate and a polarizer. In this case, although the retardation and azimuth of birefringence can be calculated, wavefront aberration cannot be calculated. Hence, non-polarization aberration and polarization aberration must be calculated using separate units. This increases the unit driving time and the measurement time, making it impossible to perform high-speed measurement. The two units must be aligned with the optical axis. Depending on the alignment accuracy, a difference may occur in measurement of the aberration by two of the units. This can increase the error.

With the method of Japanese Patent Laid-Open No. 2005-116732, although the Mueller matrix can be calculated accurately as polarization aberration, non-polarization aberration must be measured separately. Japanese Patent Laid-Open No. 2005-116732 does not disclose a method for this separate measurement.

The object of each of the prior art documents as described above is different from that of the present invention, which is aimed at simultaneous measurement of non-polarization aberration and polarization aberration.

Furthermore, each of Japanese Patent Laid-Open No. 2002-71515, No. 2-116732 and No. 2005-116732, and PCT Publication No. WO 2003/028073 has the premise that measurement is performed with parallel light. This is for the following reason. In Japanese Patent Laid Open No. 2002-71515, and No. 2005-116732, and in PCT Publication No. WO 2003/028073, a phase shifter, a polarizer, and the like, are arranged before a light-receiving portion. As the phase shifter and polarizer have characteristics that differ depending on the incident angle, they can be used only for measurement with parallel light. Likewise, since Japanese Patent Laid-Open No. 2-116732 uses a Mach-Zehnder interferometer, it has a premise that measurement is performed with parallel light. Therefore, the methods of Japanese Patent Laid-Open No. 2002-71515, No. 2-116732 and No. 2005-116732, and PCT Publication No. WO 2003/028073 can be adapted only for measurement with parallel light.

As described above, the conventional methods cannot measure non-polarization aberration and polarization aberration (retardation and azimuth of birefringence) as the optical characteristics of the projection optics, simultaneously, at high speed and accurately, in the exposure apparatus.

SUMMARY OF THE INVENTION

The present invention has been made on the basis of the recognition of the above problems, and has as its object to provide an exposure apparatus that has a function of measuring the optical characteristics of, e.g., projection optics at high speed and accurately.

An exposure apparatus according to a first aspect of the present invention relates to an exposure apparatus including an illumination system, which illuminates an original, and projection optics, which projects a pattern of the original, illuminated by the illumination system, onto a substrate. The exposure apparatus comprises an interferometer, which forms an interference pattern, including aberration information on the projection optics, using a polarized light beam emitted from the illumination system, and a processor, which calculates optical characteristics of the projection optics the basis of the interference formed by the interferometer. The illumination system includes a polarization controller, which sequentially generates at least three different polarized light beams with respective polarization states different from each other. The processor calculates the optical characteristics of the projection optics on the basis of the interference pattern sequentially formed by the interferometer, using at least three different polarized light beams sequentially generated by the polarization controller. The optical characteristics include non-polarization aberration, which does not depend on a polarization state of light entering the projection optics, and polarization aberration, which does depend on the polarization state of the light entering the projection optics.

An exposure apparatus, according to a second aspect of the present invention, relates to an exposure apparatus including an illumination system, which illuminates an original, and projection optics, which projects a pattern of the original, illuminated by the illumination system, onto a substrate. The exposure apparatus comprises an interferometer, which forms an interference pattern including aberration information on the projection optics using a polarized light beam emitted from the illumination system, and a processor, which calculates optical characteristics of the projection optics on the basis of the interference pattern formed by the interferometer. The illumination system includes a polarization controller which sequentially generates at least two different polarized light beams with polarization states different from each other. The interferometer is provided with a polarizer which transmits light having a predetermined polarization transmitted through the projection optics. The processor rotates the polarizer and calculates the optical characteristics of the projection optics on the basis of at least four interference patterns sequentially formed by the interference.

A third aspect of the present invention relates to a device manufacturing method, and the method comprises the steps of exposing a substrate coated with a photosensitive agent with a pattern by an exposure apparatus, and developing the substrate exposed with the pattern.

The present invention can provide an exposure apparatus that comprises a function of measuring the optical characteristics of, e.g., projection optics at high speed and accurately.

Further features of the present invention will become apparent from the following description of exemplary embodiments, with reference to the attached drawings.

BRIEF DESCRIPTION OF THE DRAWINGS

FIG. 5 is a table showing examples of a measurement reticle and a wafer-side measurement pattern;

FIG. 10 is a view showing the schematic arrangement of an exposure apparatus according to a seventh embodiment of the present invention.

FIGS. 16A and 16B are views showing pinhole arrays;

FIG. 23 is a flow chart showing an example of a device manufacturing method; and FIG. 24 is a flowchart showing a wafer fabrication process.

DESCRIPTION OF THE EMBODIMENTS

The preferred embodiments of the present invention will now be described with reference to the accompanying drawings.

First Embodiment

Figure 1:
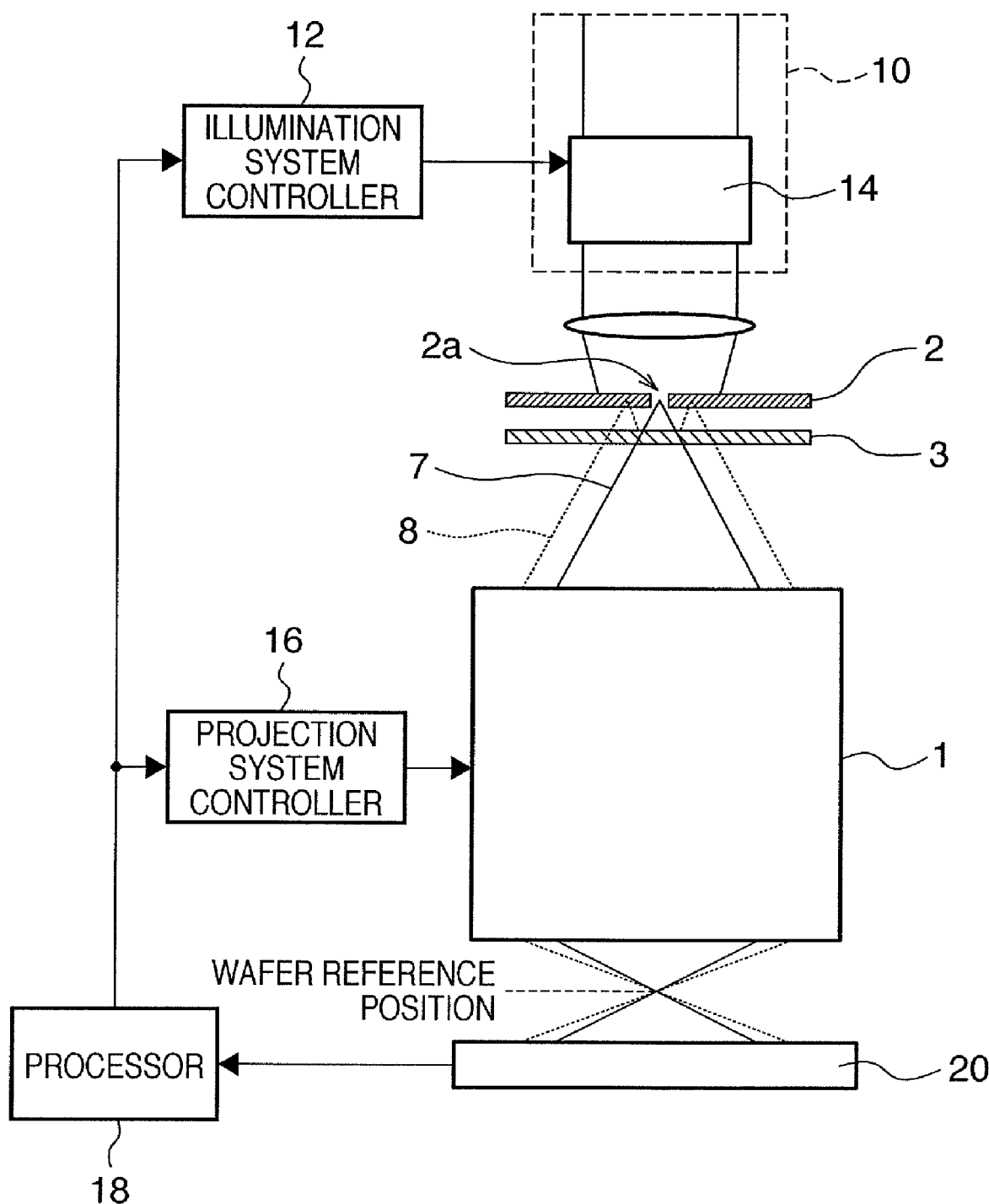
FIG. 1 is a view showing the schematic arrangement of an exposure apparatus according to a first embodiment of the present invention.

An exposure apparatus according to the first embodiment of the present invention will be described with reference to FIG. 1. The first embodiment provides an exposure apparatus that includes means for measuring non-polarization aberration and polarization aberration, which are the optical characteristics of the projection optics, using a radial shear interferometer (RSI). An example will be described in which, of the optical characteristics, aberration that does not depend on polarization is defined as non-polarization aberration and aberration that depends on polarization is defined as polarization aberration, and retardation and azimuth of birefringence are to be measured as polarization aberration.

In ordinary exposure, light provided by an illumination system 10 illuminates an exposure reticle (original), and the pattern of the reticle is projected onto a wafer (substrate) set at a wafer reference position through projection optics. The wafer reference position is identical to the focal point of the projection optics 1.

In measurement of the optical characteristics of the projection optics 1, a polarization controller 14 arranged in the illumination system 10 generates a plurality of different polarized light beams having different polarization states. A radial shear interferometer, which uses these polarized light beams, is provided by exchanging the exposure reticle for a measurement reticle (first measurement member) 2, and a measurement substrate (second measurement member) 3 is inserted near the lower surface of the measurement reticle 2.

In the radial shear interferometer according to this embodiment, the interferometer can be constituted by inserting only the measurement reticle 2 and measurement substrate 3 on the reticle side, without arranging any optical element on the wafer side, where the NA is large. This radial shear interferometer is a common path interferometer in which two beams forming interference fringes pass along a common optical path. Thus, the optical path and arrangement are simple and hardly influenced by vibration of the exposure apparatus.

Conventionally, to measure a polarized light beam, a phase shifter and a polarizer must be used. As these optical elements have characteristics that change depending on the incidence angle, they can be used only for parallel light. In this embodiment, a beam, which is emitted from the projection optics (detection target optical system) 1, enters an image sensor (e.g., a CCD) 20, serving as a detector, and stays as divergent light. Hence, even in the absence of a phase shifter or polarizer, retardation and azimuth, which are non-polarization aberration and polarization aberration, can be measured. A specific arrangement and processing method will now be described.

To measure non-polarization aberration and polarization aberration (retardation and azimuth), the polarization controller 14 generates a desired polarized light beam. Various types of arrangements can implement the polarization controller 14. For example, when the illumination system generates a linearly polarized light beam as exposure light, the polarizing direction of the linearly polarized light beam can be changed by rotation, e.g., using a half-wave plate. When the illumination system 10 also generates a circularly polarized light beam as the exposure light, a half-wave plate and a quarter-wave plate are arranged, and their combination can generate a linearly polarized light beam and a circularly polarized light beam having desired incidence angles.

A pinhole 2a can be arranged in the measurement reticle 2. The pinhole 2a shapes the wavefront of illumination light to an ideal wavefront. The measurement substrate 3 splits the ideal wavefront emitted from the pinhole 2a into the wavefront of light 7 to be transmitted through the measurement substrate 3 and the wavefront of light 8 reflected by the upper surface of the measurement substrate 3.

The transmitted light 7 passes through the projection optics 1, so that its wavefront changes to a wavefront having information on the aberration of the projection optics 1. The upper surface of the measurement substrate 3 and the lower surface of the measurement reticle 2 reflect the reflected light 8. The optical path of the reflected light thus expands in the radial direction, having the optical axis of the projection optics 1 as the center, and the expanded reflected light 8 passes through the projection optics 1. The transmitted light 7 and reflected light 8, transmitted through the projection optics 1, form an image on or near the imaging plane (wafer reference position) of the projection optics 1.

Concentric interference fringes formed by the interference of the transmitted light 7 and reflected light 8 are observed by the image sensor 20. The image sensor 20 may be arranged above the wafer reference position or under it. A two-dimensional image sensor, such as, for example, a CCD, is suitable as the image sensor 20.

The distance between the reflecting surface of the measurement substrate 3 and the reflecting surface of the measurement reticle 2 (that is, the distance between the reflecting surfaces) determines the shear ratio of the transmitted light 7 to the reflected light 8 (that is, the proportion of the difference between the two wavefronts). When the distance between the reflecting surfaces increases, although the shear ratio increases, the pitch of the interference fringes decreases. Hence, the distance between the reflecting surfaces must be optimized, considering both the shear ratio and the pitch of the interference fringes. The shear ratio is preferably set between 1% and 10%.

The measurement substrate 3 must not only reflect, but also, must transmit, the exposure light. This limits the material of the measurement substrate 3 to one that transmits the exposure light. To decrease unwanted light, an anti-reflection film is preferably added to the lower surface of the measurement substrate 3, to decrease reflection by the lower surface of the measurement substrate 3.

Furthermore, reflection by the upper surface of the measurement substrate 3 and by the lower surface of the measurement reticle 2 generates the reflected light 8. If the reflectance of the upper surface of the measurement substrate 3 and that of the lower surface of the measurement reticle 2 are excessively high, although the intensity of the reflected light increases, the influence of multiple-reflected light degrades the visibility of the interference fringes, and sometimes, makes accurate wavefront measurement impossible.

To reduce the adverse influence of multiple reflections and to perform accurate measurement, it is appropriate to optimize the reflectance of the upper surface of the measurement substrate 3 and that of the lower surface of the measurement reticle 2, such that the visibility of the interference fringes becomes, e.g., approximately 0.3 to 0.4.

This radial shear interferometer can shift the phase by driving the measurement substrate 3 along the optical axis. By using a plurality of phase-shifted interference fringes, the phase of the projection optics 1 can be calculated accurately. To drive the measurement substrate 3, for example, a piezoelectric element can be used.

More specifically, for example, to change the phase every $\lambda/4$, the measurement substrate 3 is driven to three positions for each $\lambda/8$, which is half of $\lambda/4$, and interference fringes are obtained at each position.

A phase $\phi(x, y)$ of the projection optics 1 is calculated in accordance with equation (1). This phase is a differential phase between the wavefront of the transmitted light 7 and that of the reflected light 8. For example, when using the three position method, which performs measurement by determining the phase shift as $0\pm\alpha$, the phase $\phi(x, y)$ can be calculated in accordance with equation (1):

$$\phi(x, y) = \tan^{-1}\left\{\left[\frac{1-\cos\alpha}{\sin\alpha}\right]\frac{I_1 - I_3}{2I_2 - I_1 - I_3}\right\} \quad (1)$$

The interface fringes can be measured a number of times corresponding to the number of times of phase shift. Accordingly, if the number of times of the phase shift is large, the calculation accuracy of the phase measurement increases. The position count of the phase shift is, for example, three steps, four steps, five steps, seven steps, nine steps, thirteen steps, or the like.

In the above phase calculation, the phase shift method need not be used, but a method of calculating the wavefront from one image frame by using the electron moiré method or Fourier transformation may be employed. Generally, the accuracy of the electron moiré method or Fourier transformation is said to be slightly inferior to that of the phase shift method. On the other hand, however, the electron moiré method or Fourier transformation is advantageous in that it can process an image with only one captured image frame. A preferable method may be selected from the viewpoint of the total measurement accuracy by considering the vibration, phase shift error, and the like.

According to the electron moiré method, the interferometer generates the interference fringes of the projection optics 1 on which carrier fringes overlap, and the interference fringes are observed by the image sensor 20, serving as the detector. A computer generates reference pattern signals corresponding to three or more frames, which have the same frequency as that of the fringe image, but are phase-shifted by a predetermined amount, and multiplies them by the signal of the fringe image. A phase distribution can be obtained from three or more frames of moiré fringe images, which are obtained by extracting low-frequency components from signals obtained by multiplication.

According to the Fourier transformation, first, the interference fringes are subjected to two-dimensional Fourier transformation. In a frequency space, interference spectra corresponding to the X- and Y-direction shear wavefronts are extracted. The obtained frequency distribution is subjected to inverse Fourier transformation to yield two, X- and Y-direction differential wavefronts. By synthesizing the two differential wavefronts, phase information can be obtained.

Since both the electronic moiré method and Fourier transformation can calculate the phase from one frame of a fringe image, they do not require driving of the measurement substrate 3, have excellent vibration resistance, and are capable of high speed processing.

The wavefront of the transmitted light 7 and that of the reflected light 8 are wavefronts obtained as the ideal wavefront changes in accordance with the optical characteristics of the projection optics 1, which include two wavefronts having the aberration information on the projection optics 1 and are slightly shifted from each other in the radial direction. A wavefront obtained by the phase shift is a differential phase between the wavefront of the transmitted light and that of the reflected light.

The aberration information on the projection optics 1 to be measured includes two aberrations, i.e., non-polarization aberration, which is caused by lens misalignment, or the like, and does not depend on polarization, and polarization aberration, which is due to distortion caused by holding a lens or by heating of the lens, and depends on polarization. In each of the wavefront of the transmitted light and that of the reflected light, non-polarization aberration and polarized light aberration are mixed. Therefore, with wavefront information obtained from one incident light beam, non-polarization aberration and polarization aberration cannot be separated.

Hence, to obtain non-polarization aberration and polarization aberration separately, the polarization controller 14 of the illumination system 10 generates a number of linearly polarized light beams (e.g., 0°, 90°, +45°, and −45°). In the present embodiment, four linearly polarized light beams having the above respective polarizations enter the projection optics 1, to measure four pieces of wavefront information.

More specifically, first, the illumination system 10 generates a linear horizontally polarized light beam, and the wavefront information on the projection optics 1 is obtained using the radial shear interferometer described above. At this time, a wavefront, in which non-polarization aberration and polarization aberration of the linearly horizontally polarized light beam are mixed, is obtained. Similarly, the illumination system 10 generates a linear vertically polarized light beam and linear ±45° polarized light beams, and the same measurement is repeated for each direction. This provides a total of four pieces of wavefront information. In this example, four different linearly polarized light beams, the polarizing directions, which differ from each other by ±45°, are obtained.

In wavefront information measured using a polarized light beam in one direction, non-polarization aberration, which does not depend on polarization, and polarization aberration, which does, are mixed. As non-polarization aberration does not depend on polarization, it does not change, even if measurement is performed using a polarized light beam in any direction. On the other hand, polarization aberration changes depending on the polarizing direction. Hence, non-polarization aberration and polarization aberration can be expressed as equations (2):

wavefront of horizontally polarized light beam=non-polarization aberration+polarization aberration (0°);

wavefront of vertically polarized light beam=non-polarization aberration+polarization aberration (90°);

wavefront of +45° polarized light beam=non-polarization aberration+polarized aberration (+45°); and wavefront of −45° polarized light beam=non-polarization aberration+polarization aberration (−45°)     (2)

Concerning the azimuth of birefringence, which is polarization aberration, the phase advancing axis and phase delaying axis are perpendicular. If the phase advancing axis is in the 0° direction, the phase delaying axis is in the 90° direction. Similarly, if the phase advancing axis is in the +45° direction, the phase delaying axis is in the −45° direction.

Assume that the phase advancing axis of the birefringence of the projection optics 1 is in the 0° direction. If a linearly horizontally polarized light beam enters the projection optics 1, as the phase advancing axis coincides with the incident polarized light beam, the wavefront entirely advances from the non-polarization aberration by an amount corresponding to the retardation. If a linear vertically polarized light beam enters the projection optics 1, as the phase delaying axis coincides with the incident polarized light beam, the wavefront entirely delays from the non-polarization aberration by an amount corresponding to the retardation. When the advance of the wavefront is expressed as + and the delay of the wavefront is expressed as −, the signal of the polarization aberration is reversed between the two cases, as in equations (3). The same may apply to the relationship between the +45° incident polarized light beam and −45° incident polarized light beam.

polarization aberration (0°)     (3)

= −(polarization aberration) (90°)

polarization aberration (+45°)

= −(polarization aberration) (+45°)

Using equations (3), equations (2) can be rewritten as equations (4):

wavefront of horizontal incidence=non-polarization aberration+polarization aberration (0°);

wavefront of vertical incidence=non-polarization aberration−polarization aberration (0°);

wavefront of +45° incidence=non-polarization aberration+polarization aberration (+45°); and wavefront of −45° incidence=non-polarization aberration−polarization aberration (+45°)     (4)

Using equations (4), non-polarization aberration and polarized aberration can be separated as in equations (5):

$$\text{non-polarization aberration} \quad (5)$$
$$= (\text{wavefront of horizontal incidence} + \text{wavefront of vertical incidence})/2$$
$$= (\text{wavefront of } +45° \text{ incidence} + \text{wavefront of } -45° \text{ incidence})/2$$
$$= (\text{wavefront of horizontal incidence} + \text{wavefront of vertical incident} + \text{wavefront of } +45° \text{ incidence} + \text{wavefront of } -45° \text{ incidence})/4$$
$$\text{non-polarization aberration at } 0°$$
$$= (\text{wavefront of horizontal incidence} - \text{wavefront of vertical incidence})/2$$
$$\text{non-polarization aberration at } 45°$$
$$= (\text{wavefront of } +45° \text{ incidence} - \text{wavefront of } -45° \text{ incidence})/2.$$

Rewriting the equations in the above manner shows that it is important to use a plurality of polarized light beams having different polarization states (directions). With a wavefront, which is measured using a linear horizontally polarized light beam and a linear vertically polarized light beam, or a linear +45° polarized light beam and a linear −45° polarized light beam, from equations (4), polarization aberration and non-polarization aberration can be separated. As polarization aberration, however, includes two variables, i.e., retardation and azimuth, to separate polarization aberration and non-polarization aberration, two polarization aberrations are necessary, i.e., polarization aberration at 0° and polarization aberration at +45°.

Namely, to separate non-polarization aberration and polarization aberration, two sets of two linearly polarized light beams, the polarizing directions of which are different from each other by 90° (perpendicular to each other), must be used. In place of the two linearly polarized light beams, the polarizing directions of which are different from each other by 90°, two circularly polarized light beams, i.e., a right circularly polarized light beam and a left circularly polarized light beam, may be used.

To facilitate understanding, a case has been described which uses two incident polarized light beams. As is apparent from equations (4), the wavefront of −45° incidence can be calculated from three wavefronts, i.e., the wavefront of horizontal incidence, the wavefront of vertical incidence, and the wavefront of +45° incidence. Therefore, by measuring the wavefront using three incident polarized light beams, i.e., a horizontally incident polarized light beam, a vertically incident polarized light beam, and a +45° incident polarized light beam, non-polarization aberration and polarization aberration can be calculated separately.

As described above, by using three wavefronts measured using at least three incident polarized light beams, non-polarization aberration and polarization aberration can be calculated separately.

The interferometer described in the first embodiment is a radial shear interferometer, which detects the difference between the wavefront of transmitted light and that of reflected light. Hence, the differential wavefront of the aberration component of non-polarization aberration, which does not depend on polarization, and that of polarization aberration, which does, can be obtained by the radial shear interferometer. The finally required non-polarization aberration and polarized light aberration (retardation and azimuth of birefringence) can be calculated by integrating these differential wavefronts.

As described above, when forming interference fringes using four (at least three) incident polarized light beams and calculating non-polarization aberration and polarization aberration from the interference fringes, the relationship among the four types of wavefronts must be grasped. According to the radial shear method of this embodiment, interference of two wavefronts, which are shifted from each other in the radial direction with reference to the optical axis, can be measured, and concentric interference fringes about the optical axis as the center can be obtained. A point on the optical axis (the central point of the concentric interference fringes and, at the same time, the central point of the wavefront) serves as the reference of the two wavefronts and is not sheared (shear ratio: zero). In other words, the differential wavefront to be measured is zero at the center. Hence, the relationship among the four types of wavefronts can be identified at the central point where the shear ratio is zero. The processor 18 calculates the relationship among the wavefronts of the four different polarized light beams on the basis of the information on the central point where the shear ratio is zero, and the non-polarization aberration and the polarization aberration (retardation and azimuth) of the projection optics 1 using equations (2) to (5).

The central point where the shear ratio is zero is also significant when integrating the differential wavefronts to calculate the retardation and azimuth of the projection optics. Integration requires a reference point. As the reference point, the central point where the shear ratio is zero can be used.

As is apparent from equations (5), non-polarization aberration is given by the average of wavefronts measured using two beams, i.e., a linear horizontally polarized light beam and a linear vertically polarized light beam, the average of wavefronts measured using two beams, i.e., a linear +45° polarized light beam and a linear −45° polarized light beam, or the average wavefronts measured using four linearly polarized light beams. This embodiment describes a case that uses a linear horizontally polarized light beam, a linear vertically polarized light beam, a linear +45° polarized light beam, and a linear −45° polarized light beam. However, non-polarization aberration can also be obtained from the average of wavefronts measured using two linearly polarized light beams, the polarizing directions of which are different from each other by 90° (perpendicular), or the average of wavefronts measured using two circularly polarized light beams, i.e., a right circularly polarized light beam and a left circularly polarized light beam.

Furthermore, regarding non-polarization aberration, it is apparent that it can also be calculated from the average of interference fringe intensities. When using the intensities, however, error components increase. Hence, it is preferable to obtain non-polarization aberration on the basis of wavefront (phase) information.

As described above, according to this embodiment, the polarization controller 14 sequentially generates polarized light beams in four directions, i.e., 0, 90°, +45°, and −45° directions (with an arbitrary order). The image sensor 20 captures four interference fringes sequentially generated by the respective polarized light beams. The images of the interference fringes, captured by the image sensor 20, are provided to the processor 18. The processor 18 generates wavefront information respectively from the sequentially obtained four interference fringes, and calculates the non-polarization aberration and polarization aberration (retardation and azimuth of birefringence) of the projection optics 1 on the basis of the four pieces of generated wavefront information.

Furthermore, according to this embodiment, on the basis of the non-polarized light wavefront obtained by measurement, and the polarized light wavefront information, an illumination system controller 12 adjusts the illumination system 10, and a projection system controller 16 adjusts the projection optics 1. Non-polarization aberration depends on the shapes and surface spacings of the lenses, and polarization aberration is changed by holding/stressing the optical system or by temperature differences in the optical system. Hence, for example, the projection system controller 16 changes the spacings of the lenses which constitute the projection optics 1 or the holding states of the lenses, and the illumination light distribution on the pupil, so that the illumination light propagates onto the wafer in an optimal state by considering the polarization aberration of the projection optics 1.

In this manner, by including a feedback system which repeats measurement and correction, exposure can be optimized.

A method of measuring the optical characteristics of the projection optics 1 has been described above. Naturally, a system that measures the optical characteristics of the illumination system 10 may be additionally provided, and both the projection optics and the illumination system may be optimized.

Although an illumination system controller and a projection system controller, which respectively control the illumination system 10 and projection optics 1 in accordance with the measurement result, are not illustrated, they can be provided to all of the embodiments.

A case has been described in which the projection optics is fixed, and non-polarization aberration and polarization aberration are measured using four different linearly polarized light beams, the directions of which are different from each other by +45°. The same information can also be obtained by fixing the polarizing direction and rotating the projection optics 1 successively through +45°.

In this embodiment, although the directions of the four polarized light beams to enter the projection optics 1 are 0, 90°, +45°, and −45°, the directions are not limited to them. The same effect can also be obtained by using two sets of two perpendicular linearly polarized light beams. For example, assume that the first set of polarized light beams includes a linear X°-direction polarized light beam and a linearly polarized light beam in a direction perpendicular to it, that is, a linear (X°+90)-direction polarized light beam. The second set of polarized light beams can include polarized light beams respectively obtained by rotating the two polarized light beams of the first set through +45°, that is, a linear (X°+45°)-direction polarized light beam and a linear (X°+135°) (or X°−45°)-direction polarized light beam. Naturally, the angle formed by the two perpendicular linearly polarized light beams of each of the two sets is not limited to +45°.

The number of directions of polarized light beams to enter the projection optics 1 is not limited to four. Use of polarized light beams in at least three directions enables measurement of non-polarization aberration and polarization aberration simultaneously. As an example, a case will be described hereafter which uses three beams, i.e., a linear horizontally polarized light beam, a linear +45° polarized light beam, and a linearly polarized vertically polarized light beam (three different linearly polarized light beams, the polarizing directions of which are different from each other by +45°).

In the case that uses three incident polarized light beams, the non-polarization aberration and polarization aberration of the projection optics can be calculated in accordance with equations (6):

wavefront of horizontal incidence=non-polarization aberration+polarization aberration (0°);

wavefront of +45° incidence=non-polarization aberration+polarization aberration (+450);

wavefront of vertical incidence=non-polarization aberration+polarization aberration (90°);

non-polarization aberration=(wavefront of horizontal incidence+wavefront of vertical incidence)/2;

polarization aberration at 0°=(wavefront of horizontal incidence−wavefront of vertical incidence)/2; and $$\text{polarization aberration at} + 45° =$$

$$\text{wavefront of} + 45° \text{ incidence} - \text{non} - \text{polarization aberration} =$$

$$\text{wavefront of} + 45° \text{ incidence} -$$

$$(\text{wavefront of horizontal incidence} +$$

$$\text{wavefront of vertical incidence})/2. \qquad (6)$$

As described above, with information using three or more polarized light beams, the non-polarization aberration and polarization aberration of the projection optics can be measured simultaneously. Although the directions of polarized light beams to enter the projection optics 1 are 0°, +45°, and 90° in the above description, these directions are arbitrary, and other directions can be used.

If the directions of the polarized light beams to be used are perpendicular, the calculation will be simple. Even when the directions of polarized light beams are three arbitrary directions that are not perpendicular, if adopting the above equations by considering the proportion of the wavefront of incidence, the non-polarization aberration and polarization aberration of the projection optics can be obtained in the same manner.

For example, when performing measurement using three beams, i.e., a linear horizontally polarized light beam, a linear +30° polarized light beam, and a linear +60° polarized light beam, the non-polarization aberration and polarization aberration of the projection optics can be calculated in accordance with equations (7):

wavefront of horizontal incidence=non-polarization aberration+polarization aberration (0°);

wavefront of +30° incidence=non-polarization aberration+polarization aberration (+30°);

wavefront of +60° incidence=non-polarization aberration+polarization aberration (+60°);

non-polarization aberration=wavefront of horizontal incidence+wavefront of 30° incidence−wavefront of +60° incidence;

polarization aberration at 0°=wavefront at +30° incidence−wavefront of +60° incidence; and polarization aberration at +45°=−2√3*(wavefront of horizontal incidence)+3/√3*(wavefront of +30° incidence)−1/√3+(wavefront of +60° incidence)   (7)

In this manner, according to this embodiment, the non-polarization aberration and the polarization aberration of the projection optics can be calculated separately from interference fringes measured using at least three incident polarized light beams.

In recent years, the numerical aperture of the exposure apparatus has increased, and an immersion material is used on the image sensing side, making it difficult to arrange an optical element on the image sensing side. In particular, since a phase shifter and a polarizer, which are often employed for measuring the polarization state, are used near parallel light, large limitations are often imposed when arranging them on the image sensing side.

For this reason, if non-polarization aberration and polarization aberration can be calculated by only using at least three different incident polarized light beams without arranging an optical element on the image sensing side, as in this embodiment, an advantage can be obtained.

The larger the number of directions of polarized light beams to be used, the larger the number of pieces of phase information, and the higher the measurement accuracy. If the number of polarized light beams to be used is small, error factors generated by changing the incident polarized light beams decrease. As described above, theoretically, calculation is possible as long as polarized light beams are incident in three or more directions. Hence, the number of actual incident light beams may be optimally determined by estimating the error in the apparatus.

If wavefront information measured using polarized light beams in a large number of directions is available, the retardation and azimuth, which are non-polarization aberration, can also be obtained by identifying the frequency characteristics through performing Fourier transformation.

The polarization aberration is not limited to the retardation and azimuth of birefringence, and, naturally, a Jones matrix may also be calculated.

When either a left circularly polarized light beam or a right circularly polarized light beam, in addition to the linearly polarized light beam, enters the projection optics 1, a Stokes parameter or a Mueller matrix may also be calculated as the aberration information on the projection optics 1. To cause a circularly polarized light beam to enter the projection optics, for example, not only a half-wave plate, but also, a quarter-wave plate may be arranged in the polarization controller 14 of the illumination system 10.

Figure 15:
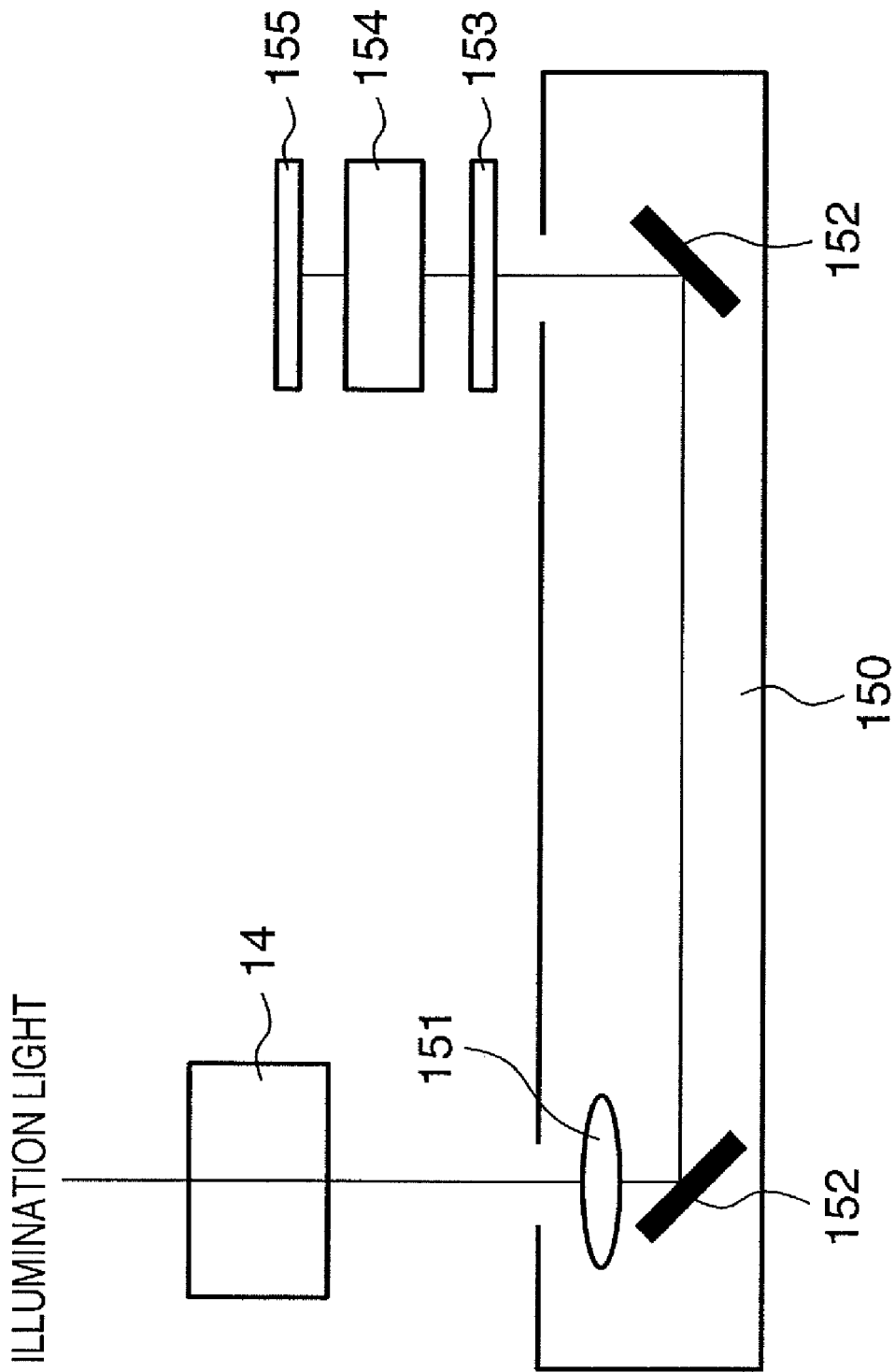
FIG. 15 is a view showing an example of an illumination light measurement reticle.

Also, it is preferable to arrange a sensor which measures the polarization state, to check whether the polarized light beam entering the projection optics 1 has a target polarization state. Such a measurement sensor allows checking of the polarization state of the polarized light beam entering the projection optics 1, enabling accurate measurement. Such a measurement sensor can be configured to include, e.g., an illumination light measurement reticle 150, as shown in FIG. 15. The reticle generally has a thickness of about 6 mm, and a pellicle is located at about 6 mm from the lower surface of the reticle, leading to a total of about 12-mm thickness.

If lenses and mirrors are arranged to be contained within the range of 12 mm, it enables measurement of the polarization state of the light entering the projection optics 1 at a reticle-side position without moving the projection optics 1. A lens 151 collimates illumination light to parallel light, and a combination of mirrors 152, phase shifter 153, polarizing element 154, and light-receiving element 155 measures the parallel light. The arrangement of the lens 151 and mirror 152 is not limited to that shown in FIG. 15, and the lens 151 may be arranged after the mirror 152. In place of the polarizing element 154, a mirror or PBS, arranged at the Brewster angle, may be used. An alignment scope may also be used to receive light.

The illumination system 10 described in this embodiment exemplifies an illumination system in an exposure apparatus. Alternatively, an illumination system dedicated to measurement may be used instead.

Even with an illumination system dedicated to measurement, the illumination system and projection optics during exposure may be optimized on the basis of the measurement result of the optical characteristics of the projection optics.

As described above, the first embodiment of the present invention exemplifies a case that uses a radial shear interferometer in which a measurement substrate is inserted between a reticle and projection optics, to calculate the non-polarization aberration and polarization aberration (retardation and azimuth) of the projection optics 1.

One of the features of the present invention resides in calculation of non-polarization aberration and polarization aberration on the basis of wavefront information obtained using polarization light beams in at least three (preferably four), directions. Hence, the arrangement of the interferometer to obtain the wavefront information is not limited to the radial shear interferometer of the first embodiment, but is applicable to embodiments using various types of interferometers, to obtain the same effect.

Second Embodiment

Figure 2:
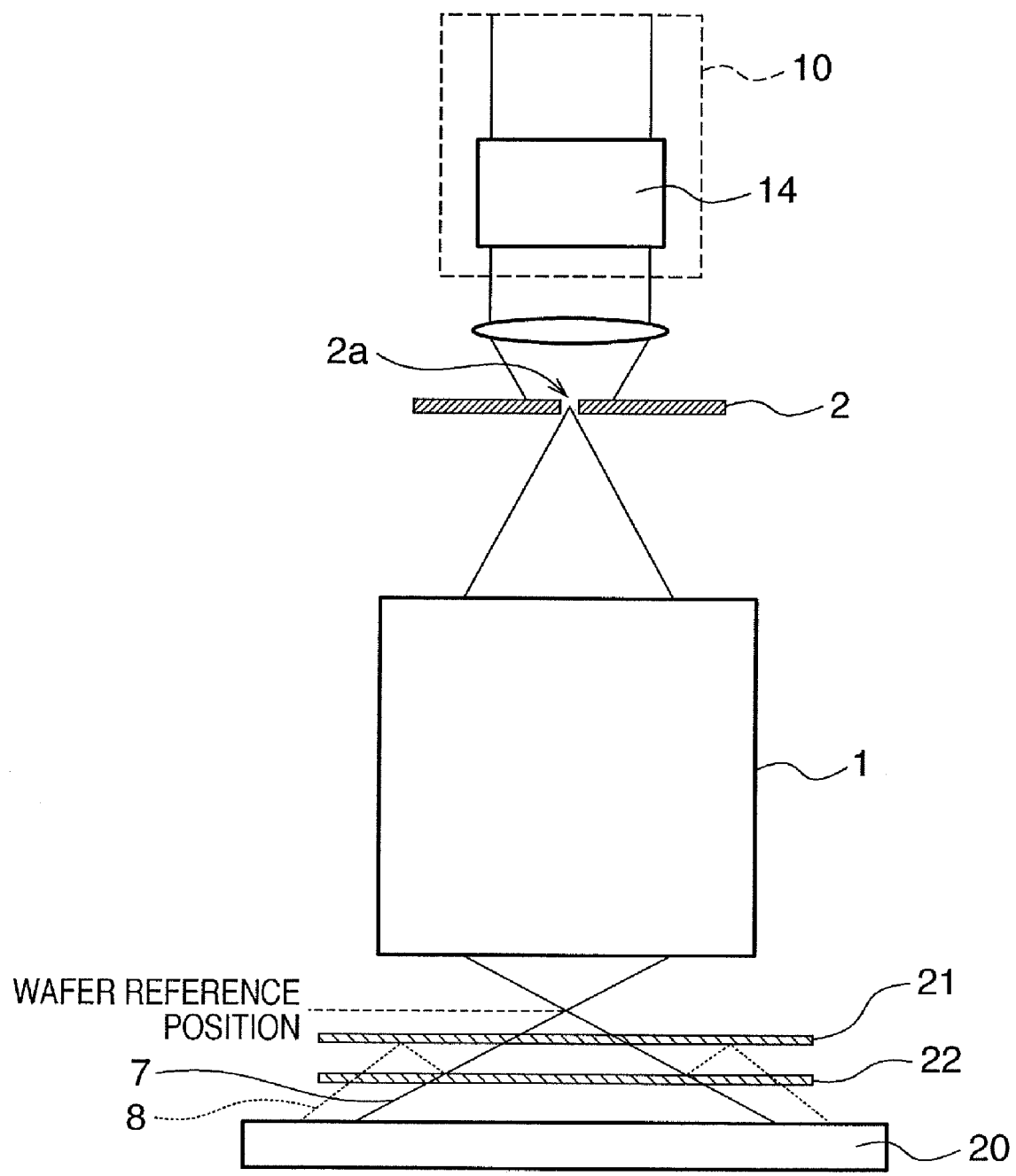
FIG. 2 is a view showing the schematic arrangement of an exposure apparatus according to a second embodiment of the present invention.

An exposure apparatus according to the second embodiment of the present invention will be described with reference to FIG. 2.

The second embodiment of the present invention provides another arrangement of the exposure apparatus that has a function of measuring non-polarization aberration and polarization aberration (retardation and azimuth), which are the optical characteristics of the projection optics, with a radial shear interferometer. An illumination system controller 12, a projection system controller 16, and a processor 18 are identical to their equivalents in the first embodiment.

In the second embodiment of the present invention, when measuring the wavefront of projection optics 1, a measurement reticle 2, having a pinhole 2a, is arranged at a reticle position, and first and second measurement substrates 21 and 22 are arranged between the projection optics 1 and an image sensor 20.

An ideal wavefront free from aberration at an illumination system 10 is obtained from the pinhole 2a of the measurement reticle 2. When the ideal wavefront is transmitted through the projection optics 1, it changes to a wavefront having aberration information on the projection optics 1. The wavefront of transmitted light 7, transmitted through the two measurement substrates 21 and 22, and the wavefront of reflected light 8, reflected between the two measurement substrates 21 and 22, interfere to form concentric interference fringes (interference pattern).

By driving at least one of the first and second measurement substrates 21 and 22 along the optical axis, the phase of light emerging from the projection optics 1 can be shifted. The wavefront information on the projection optics 1 can be obtained accurately from a plurality of phase-shifted interference fringes.

The information obtained from the interference fringes is information on a differential wavefront as the difference between the wavefront of the transmitted light 7 and that of the reflected light 8, in the same manner as in the first embodiment.

With such a radial shear interferometer, in the same manner as in the first embodiment, a polarization controller 14 of the illumination system 10 sequentially generates four different linearly polarized light beams, i.e., a linear horizontally polarized light beam, a linear vertically polarized light beam, a linear +45° polarized light beam, and a linear −45° polarized light beam, which enter the projection optics 1. The four different polarized light beams sequentially form an interference fringe, so that four pieces of wavefront information can be obtained. The non-polarization aberration and the polarization aberration (retardation and azimuth) of the projection optics 1 can be calculated on the basis of these pieces of wavefront information, in the same manner as in the first embodiment.

The wavefront of the reflected light is generated by reflection from the lower surface of the measurement substrate 21 on the projection optics side (upper side) and by the upper surface of the measurement substrate 22 on the image sensor side (lower side), of the two measurement substrates 21 and 22. It is preferable that the other surfaces each be provided with an anti-reflection film to remove unwanted light. It is desirable to optimize the reflectances of the two reflecting surfaces in accordance with the relationship between multiple reflection and the visibility of the interference fringes, as was exemplified in the first embodiment.

According to the second embodiment, in the same manner as in the first embodiment, even when the light stays as divergent light, non-polarization aberration and polarization aberration (retardation and azimuth) can be calculated without arranging a polarizer or a phase shifter between the projection optics 1 (serving as a detection target lens) and the image sensor 20. Furthermore, the second embodiment is advantageous in that information corresponding to the central portion will not be lacking, even when a pinhole is used. After the light is transmitted through the projection optics 1, it can be separated into a wavefront of transmission and a wavefront of reflection to form interference fringes. This enables more accurate measurement.

The number of directions of polarized light beams to enter the projection optics 1 is not limited to four. As described in the first embodiment, if polarized light beams in at least three directions are used, non-polarization aberration and polarization aberration can be measured simultaneously. The directions of polarized light beams can be arbitrarily selected.

Third Embodiment

Figure 3:
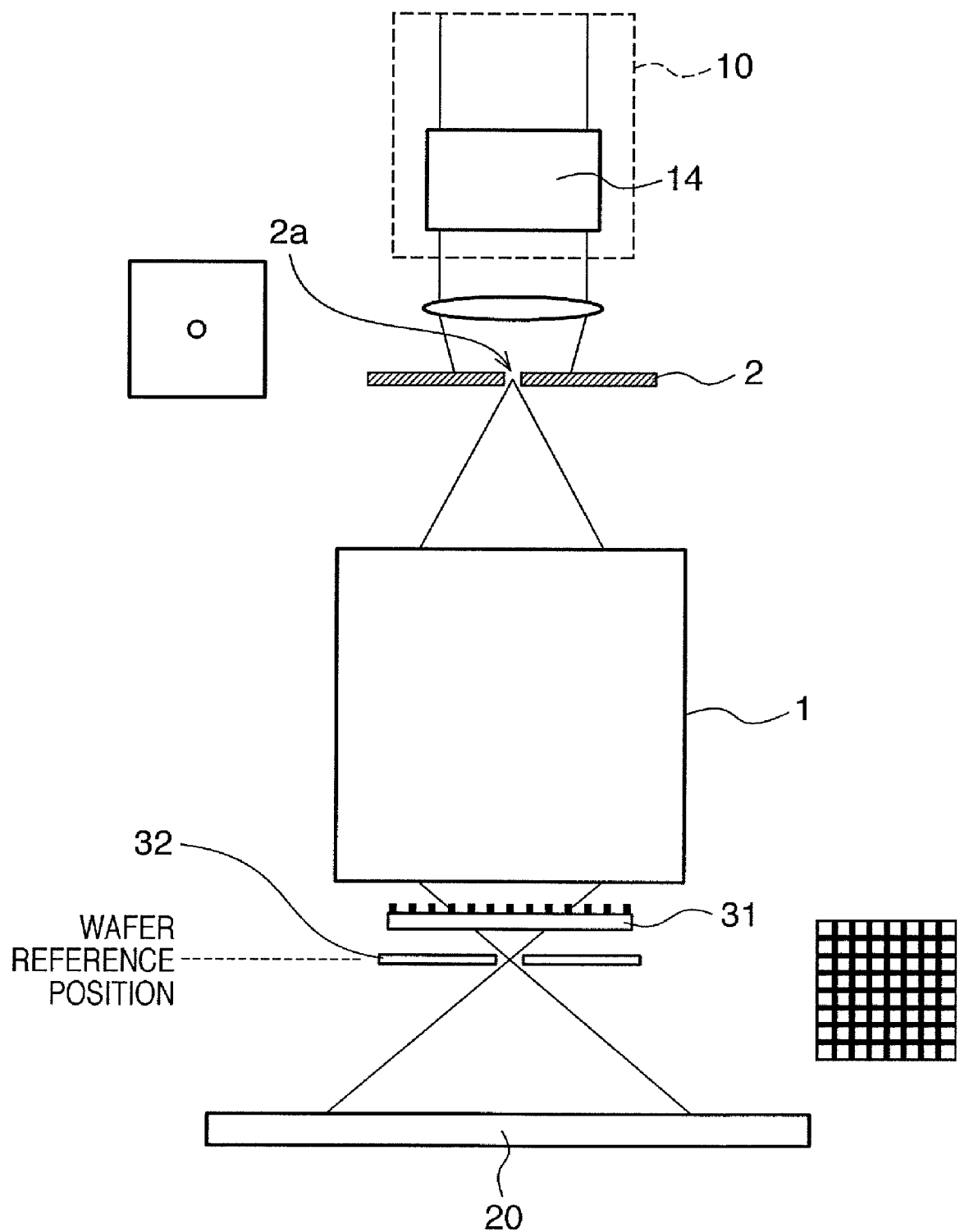
FIG. 3 is a view showing the schematic arrangement of an exposure apparatus according to a third embodiment of the present invention.

An exposure apparatus according to the third embodiment of the present invention will be described with reference to FIG. 3.

The third embodiment of the present invention provides an exposure apparatus in which a lateral shearing interferometer (LSI) measures non-polarization aberration and polarization aberration (retardation and azimuth), which are the optical characteristics of the projection optics. Since this lateral shearing interferometer is a common path interferometer, its optical path and arrangement are simple and little affected by the vibration of the exposure apparatus. An illumination system controller 12, a projection system controller 16, and a processor 18 are identical to their equivalents in the first embodiment.

In the third embodiment of the present invention, when measuring the wavefront of the projection optics 1, a measurement reticle 2, having a pinhole 2a, is arranged at a reticle position, and a two-dimensional diffraction grating 31 is arranged between the lower surface of the projection optics 1 and a wafer reference position, which serves as an image forming point of the projection optics 1. An order selection filter 32, which limits diffracted light beams, is arranged at the wafer reference position.

A lateral shearing interferometer, which uses a cross diffraction grating in which perpendicular edges are arranged two-dimensionally, is called a cross grating lateral shearing (CGLSI) interferometer.

Light having an ideal wavefront free from aberration of an illumination system 10 is obtained from the pinhole 2a of the measurement reticle 2. When the ideal wavefront is transmitted through the projection optics 1, it changes to a wavefront having aberration information on the projection optics 1. The two-dimensional diffraction grating 31 splits the wavefront, so that interference fringes of diffracted light beams with an order selected by the order selection filter can be obtained. For example, if arranging an order selection filter that extracts only a −1st-order polarized light beam and a +1st-order polarized light beam, interference fringes of the −1st-order polarized light beam and +1st-order polarized light beam can be obtained. Information obtained from these interference fringes corresponds to a differential wavefront between the −1st-order polarized light beam and +1st-order polarized light beam.

By driving the diffraction grating 31 in a direction perpendicular to the optical axis, the phase is shifted, and wavefront information on the projection optics can be obtained accurately from a plurality of phase-shifted interference fringes. With this arrangement, it is preferable to employ the method of calculating the differential phase from one frame of an interference fringe image in accordance with the electron moiré method and Fourier transformation described in the first embodiment. This enables simple measurement.

With such a lateral shear interferometer, in the same manner as in the first embodiment, a polarization controller 14 of the illumination system 10 sequentially generates four different linearly polarized light beams, i.e., a linear horizontally polarized light beam, a linear vertically polarized light beam, a linear +45° polarized light beam, and a linear −45° polarized light beam, to enter the projection optics 1. The four different polarized light beams sequentially form interference fringes, so that four pieces of wavefront information can be obtained. The non-polarization aberration and polarization aberration (retardation and azimuth) of the projection optics 1 can be calculated on the basis of these pieces of wavefront information in the same manner as in the first embodiment.

The pitch of the diffraction grating 31 can be optimized in accordance with the numerical aperture of the beam, the pitch of the measured interference fringes, and the like. If the diffraction grating changes the polarization state, the optical characteristics of the projection optics cannot be measured accurately. Hence, the pitch of the diffraction grating is, preferably, as large as possible, e.g., twice or more the wavelength, so that the diffraction grating 31 does not change the polarization characteristics.

Figure 22A:
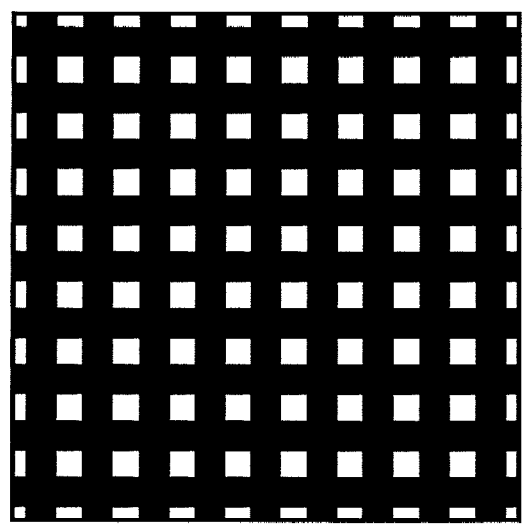
FIGS. 22A, 22B, and 22C show examples of two-dimensional diffraction gratings.
Figure 22B:
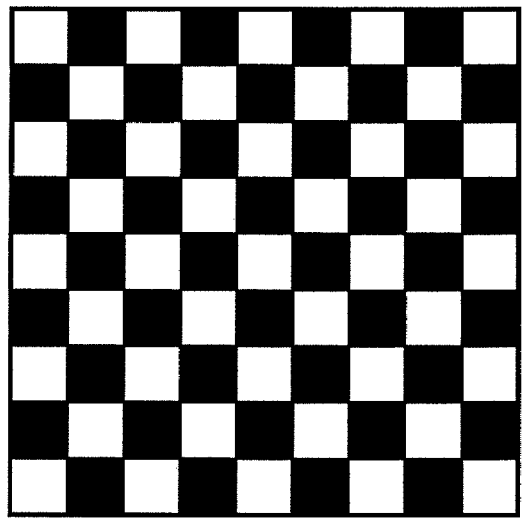
Figure 22C:
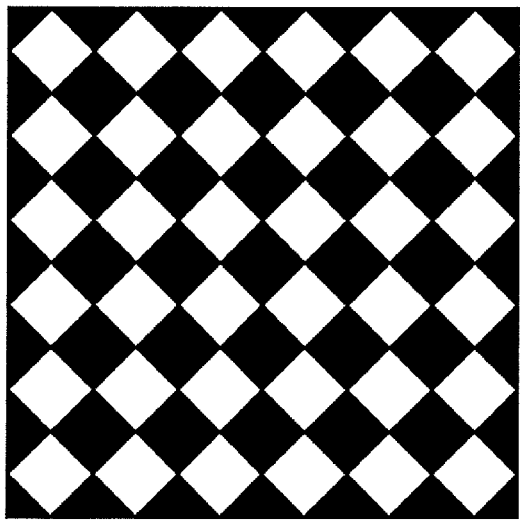

The diffraction grating can be an amplitude grating or a phase grating. FIGS. 22A, 22B, and 22C show examples of the two-dimensional diffraction grating. A vertical and horizontal grating, as shown in FIG. 22A, a checkered grating, shown in FIG. 22B, in which dark portions and bright portions are arranged in a check pattern, a grating, shown in FIG. 22C, which is obtained by rotating the grating shown in FIG. 22B through +45°, and the like, are available. The rotation angle is not limited to +45°, but any rotation angle provides the same effect. Regarding the rotation angle, if the CCD pixel array does not overlap the direction of the diffracted light beam generated by the diffraction grating, the error factors occurring in the CCD pixels can be removed better, and the wavefront can be calculated more accurately.

In particular, if a black-and-white checkered grating type phase grating having a phase difference of 180° is used with the diffraction grating pattern shown in FIG. 22B or 22C, theoretically, the 0th-order polarized light beam disappears, and the ±1st-order light beams become dominant. Thus, the light can be utilized efficiently.

In the above example, the order selection filter 32 is arranged at the wafer reference position, and the two-dimensional diffraction grating 31 is arranged between the projection optics 1 and order selection filter 32. However, the position of the two-dimensional diffraction grating is not limited to this. Even if the two-dimensional diffraction grating is arranged under the wafer reference position, as in FIG. 4, the same effect can be obtained. When the diffraction grating is arranged under the wafer reference position in this manner, although an order selection filter cannot be arranged, another advantage of accurately measuring a system error can be obtained. To measure a system error, a pinhole is arranged, not on the reticle side, but only at the wafer reference position, and an ideal wavefront free from aberration of the illumination system and projection optics is generated. The diffraction grating splits the ideal wavefront into diffracted light beams, and interference fringes formed by the diffracted light beams can be captured by the image sensor.

Aberration information on the illumination system and projection optics are eliminated from system error wavefront information obtained from the interference fringes, so the system error wavefront information represents an aberration component generated by the diffraction grating. As described above, when measuring the optical characteristics of the projection optics using the pinhole in the measurement reticle, strictly speaking, a mixture of the aberration of the projection optics and the aberration generated by the diffraction grating is obtained. Hence, if identifying the aberration information generated by the diffraction grating in advance by the pinhole arranged at the wafer reference position and performing correction on the basis of the aberration information, the aberration of the projection optics can be measured more accurately.

Not only in this embodiment, but in general, when the wafer side includes an optical component, only a wavefront in which the aberration characteristics of the projection optics and the characteristics of the optical component are mixed can be obtained. Therefore, not only in the third embodiment, but in general, when arranging an optical component between the projection optics and the image sensor, it is preferable to arrange a pinhole at the wafer reference position, as described above, to separately identify the aberration characteristics of components other than the projection optics. This can improve the measurement accuracy of the optical characteristics of the projection optics.

In the above explanation, a measurement reticle uses a pinhole, and a wafer side measurement pattern uses a two-dimensional diffraction grating, as in FIG. 5(a). It is also effective to employ a combination of a pinhole and a linear diffraction grating, instead, as in FIG. 5(b), or a combination of a slit and a diffraction grating, as in FIG. 5(c). In the example of FIG. 5(c), the wavefronts of four incident polarized light beams must be measured using a horizontal slit and a diffraction grating, and, similarly, the wavefronts of four incident light beams must be measured using a vertical slit and diffracting grating. In the example of FIG. 5(b), although the measurement time is prolonged and error factors increase, use of the slit can increase the light quantity.

As described above, if a diffraction grating and slit having a directivity are employed, the phase shift method can be used effectively. By driving the diffracting grating perpendicularly to the optical axis, and calculating the phase from a plurality of fringe images, the phase measurement accuracy can be increased.

When a slit is to be used in place of a pinhole, attention must be paid to the polarized light transmission characteristics of the slit, in the same manner as in the case of using a diffraction grating. This is because, although a pinhole transmits all linearly polarized light beams equally, a slit has different transmission characteristics for a linear horizontally polarized light beam and for a linear vertically polarized light beam.

For this reason, if the transmission characteristics of the linearly polarized light beam that differ depending on the slit shape become a problem, it is preferable to form the slit from a pinhole array, as shown in FIG. 16B.

Figure 6:
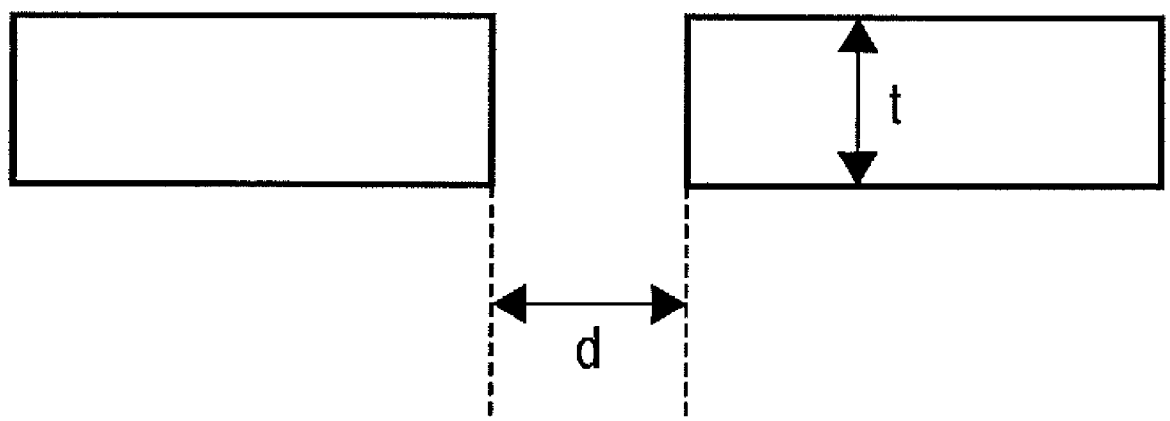
FIG. 6 is a view showing a slit section.

FIG. 6 is a view showing a section of a slit. When the slit width d is decreased, the transmittance decreases. The aspect ratio of the slit width d to a height t of a light-shielding member also influences the transmittance and polarization characteristics. It is preferable to select an optimal slit in accordance with the measurement conditions.

Naturally, not only the shapes of the slit and diffraction grating, but also, the shape of the pinhole, can be optimized in accordance with the relationship between the light quantity, wavefront, and accuracy. The number of directions of polarized light beams entering the projection optics 1 is not limited to four. As described in the first embodiment, if polarized light beams in at least three directions are used, non-polarization aberration and polarization aberration can be measured simultaneously. The direction of a polarized light beam can be selected arbitrarily.

Fourth Embodiment

Figure 7:
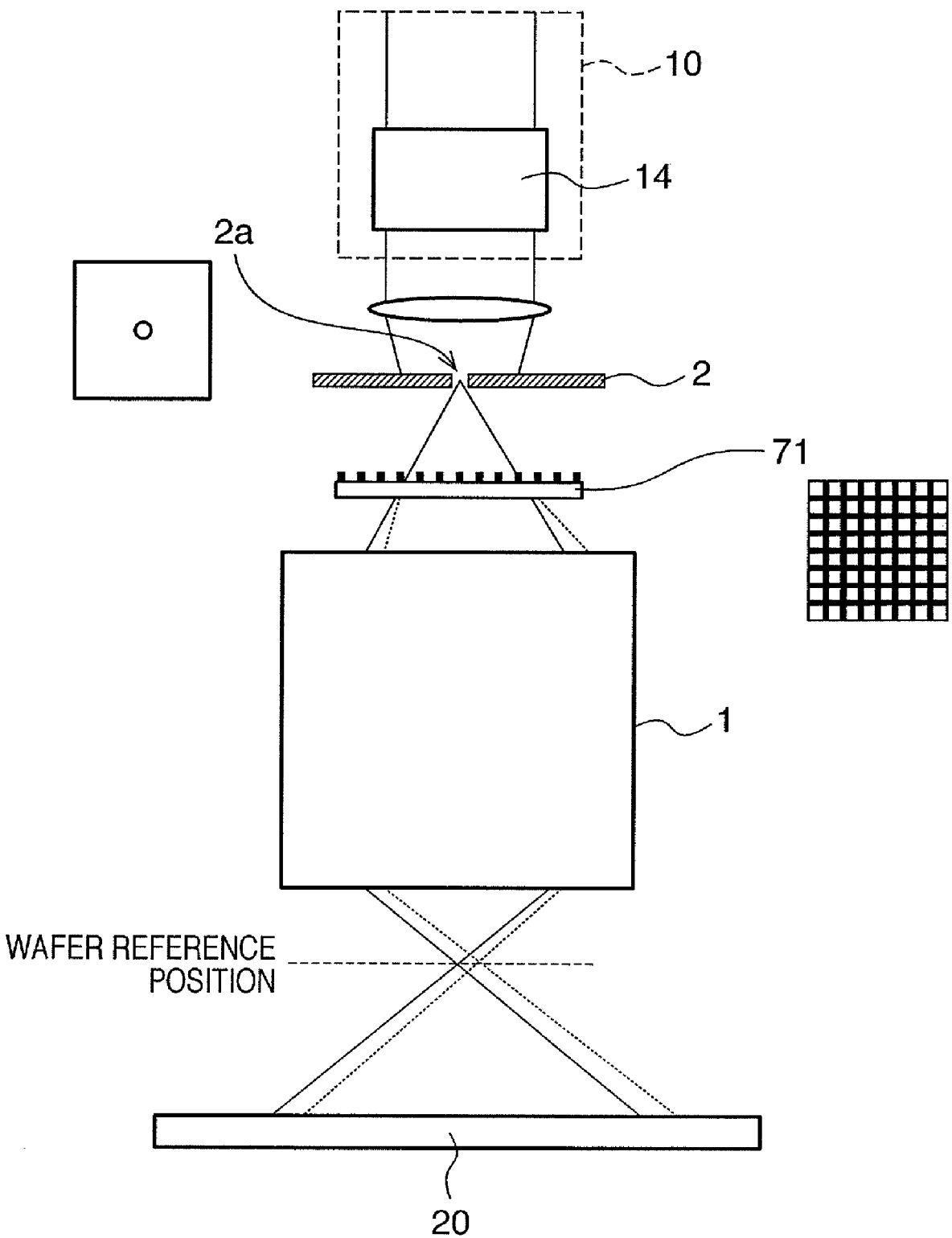
FIG. 7 is a view showing the schematic arrangement of an exposure apparatus according to a fourth embodiment of the present invention.

An exposure apparatus according to the fourth embodiment of the present invention will be described with reference to FIG. 7.

The fourth embodiment of the present invention provides another arrangement of the exposure apparatus having the function of measuring non-polarization aberration and polarization aberration (retardation and azimuth), which are the optical characteristics of the projection optics, using a lateral shearing interferometer. Since a lateral shearing interferometer is a common path interferometer, its optical path and arrangement are simple and little affected by the vibration of the exposure apparatus. In the same manner as in the third embodiment, a lateral shearing interferometer, which uses a cross diffraction grating in which perpendicular edges are arranged two-dimensionally, is called a cross grating lateral shearing (CGLSI) interferometer. An illumination system controller 12, a projection system controller 16, and a processor 18 are identical to their equivalents in the first embodiment.

In the fourth embodiment of the present invention, when measuring the wavefront of the projection optics 1, a measurement reticle 2, having a pinhole 2a, is arranged at a reticle position, and a two-dimensional diffraction grating 71 is arranged between the reticle position and the projection optics 1.

Light having an ideal wavefront free from aberration of an illumination system 10 is obtained from the pinhole 2a of the measurement reticle 2. As the ideal wavefront is transmitted through the projection optics 1, it changes to a wavefront having aberration information on the projection optics 1. The two-dimensional diffraction grating 71 splits the wavefront, so that interference fringes of diffraction light can be obtained.

By driving the diffraction grating in a direction perpendicular to the optical axis, the phase is shifted, so wavefront information on the projection optics can be obtained accurately from a plurality of phase-shifted interference fringes. When using a two-dimensional diffraction grating, however, it is preferable to employ a method of calculating the differential phase from one frame of an interference fringe image in accordance with the electron moiré method and Fourier transformation described in the first embodiment. This enables simple measurement.

With such a lateral shear interferometer, in the same manner as in the first embodiment, a polarization controller 14 of the illumination system 10 sequentially generates four different linearly polarized light beam, i.e., a linear horizontally polarized light beam, a linear vertically polarized light beam, a linear +45° polarized light beam, and a linear −45° polarized light beam, which enter the projection optics 1. The four different polarized light beams sequentially form interference fringes, so that four pieces of wavefront information can be obtained. The non-polarization aberration and polarization aberration (retardation and azimuth) of the projection optics 1 can be calculated on the basis of these pieces of wavefront information in the same manner as in the first embodiment.

The case has been described in which a measurement reticle uses a pinhole, and a wafer side measurement pattern uses a two-dimensional diffraction grating, as in FIG. 5(a). It also effective to employ a combination of a pinhole and a linear diffraction grating, as in FIG. 5(b), or a combination of a slit and a diffraction grating, as in FIG. 5(c).

In the example of FIG. 5(c), the wavefronts of four incident polarized light beams must be measured using a horizontal slit and a diffraction grating, and, similarly, the wavefronts of four incident light beams must be measured using a vertical slit and a diffraction grating. In the example of FIG. 5(b), a pinhole is used in place of a slit.

The example of FIG. 5(c), which uses a slit, has an advantage in that the pinhole can increase the light quantity. In both FIGS. 5(b) and 5(c), however, as the diffraction grating has a directivity, measurement must be performed twice, prolonging the measurement time when compared to the case of FIG. 5(a).

On the other hand, if a diffraction grating and a slit having a directivity are employed, the phase shift method can be used effectively. By driving the diffraction grating perpendicularly to the optical axis and calculating the phase from a plurality of fringe images, the phase measurement accuracy can be increased.

Actual dimensions, such as the pitch of the diffraction grating, the pinhole, the slit size, and the like, can be optimized in accordance with the wavefront to be measured, the medium, and the like.

The number of directions of polarized light beams entering the projection optics 1 is not limited to four. As described in the first embodiment, if polarized light beams in at least three directions are used, non-polarization aberration and polarization aberration can be measured simultaneously. The polarizing direction can be selected arbitrarily.

Fifth Embodiment

An exposure apparatus according to the fifth embodiment of the present invention will be described with reference to FIG. 8.

The fifth embodiment of the present invention provides yet another arrangement of the exposure apparatus having the function of measuring non-polarization aberration and polarization aberration (retardation and azimuth), which are the optical characteristics of projection optics, using a lateral shearing interferometer. Since this lateral shearing interferometer is a common path interferometer, its optical path and arrangement are simple and little affected by the vibration of the exposure apparatus. An illumination system controller 12, a projection system controller 16, and a processor 18 are identical to their equivalents in the first embodiment.

In the fifth embodiment of the present invention, when measuring the wavefront of a projection optics 1, a measurement reticle 2, having slits 2b, is arranged at a reticle position, and a diffraction grating 81 is arranged between an illumination system 10 and the measurement reticle 2. Although the basic arrangement of the fifth embodiment is similar to that of the fourth embodiment shown in FIG. 7, the position of the diffraction grating is different.

The direction of the grating of the diffraction grating 81 and the direction of the two rows of parallel slits 2b of the measurement reticle 2 must coincide with each other. In the example shown in FIG. 8, when the diffraction grating 81 is arranged in the direction indicated by reference numeral 81A, the measurement reticle 2 is arranged in the direction indicated by reference numeral 2A. When the diffraction grating 81 is arranged in the direction indicated by reference numeral 81B, the measurement reticle 2 is arranged in the direction indicated by reference numeral 2B.

First, the diffraction grating 81 and measurement reticle 2 are arranged in the directions respectively indicated by reference numerals 81A and 2A, and measurement is performed. The diffraction grating 81 splits light for the illumination system 10 into a 0th-order polarized light beam and ±1st-order polarized light beams. Of the two slit rows, for example, one transmits the 0th-order polarized light beam and the other transmits the 1st-order polarized light beams. The diffraction grating may be an amplitude grating or a phase grating, and may transmit the ±1st-order polarized light beams. The slits 2b of measurement reticle 2 change the wavefront, which is split into two in this manner by the diffraction grating 81, to ideal wavefronts in only the measuring direction. The measuring direction is the direction perpendicular to the longitudinal direction (elongated direction) of the slits.

The two wavefronts that have been changed to the ideal wavefronts by the slits are transmitted through the projection optics 1 with a slight shift, and change to two wavefronts having the aberration information on the projection optics 1. The two shifted wavefronts interfere with each other to form interference fringes. The interference fringes can be observed by an image sensor 20.

Subsequently, the diffraction grating 81 and measurement reticle 2 are rotated through 90°, so that they are arranged in the directions indicated by reference numerals 81B and 2B, respectively. Then, a similar measurement is performed. Synthesis of the two wavefronts can provide wavefront information representing a change in aberration of the projection optics.

The diffraction grating 81 also improves the coherence of the light source. Information obtained from the interference fringes represents the differential wavefront of the two beams of diffracted light.

With such a lateral shear interferometer, in the same manner as in the first embodiment, a polarization controller 14 of the illumination system 10 sequentially generates four different linearly polarized light beams, i.e., a linear horizontally polarized light beam, a linear vertically polarized light beam, a linear +45° polarized light beam, and a linear −45° polarized light beam, which enter the projection optics 1. The four different polarized light beams sequentially form interference fringes, so that four pieces of wavefront information can be obtained. The non-polarization aberration and polarization aberration (retardation and azimuth) of the projection optics 1 can be calculated on the basis of these pieces of wavefront information in the same manner as in the first embodiment. As the slits are formed in two directions, the four incident polarized light beams must be measured in the two slit directions, leading to a total of eight measurements.

Figure 8:
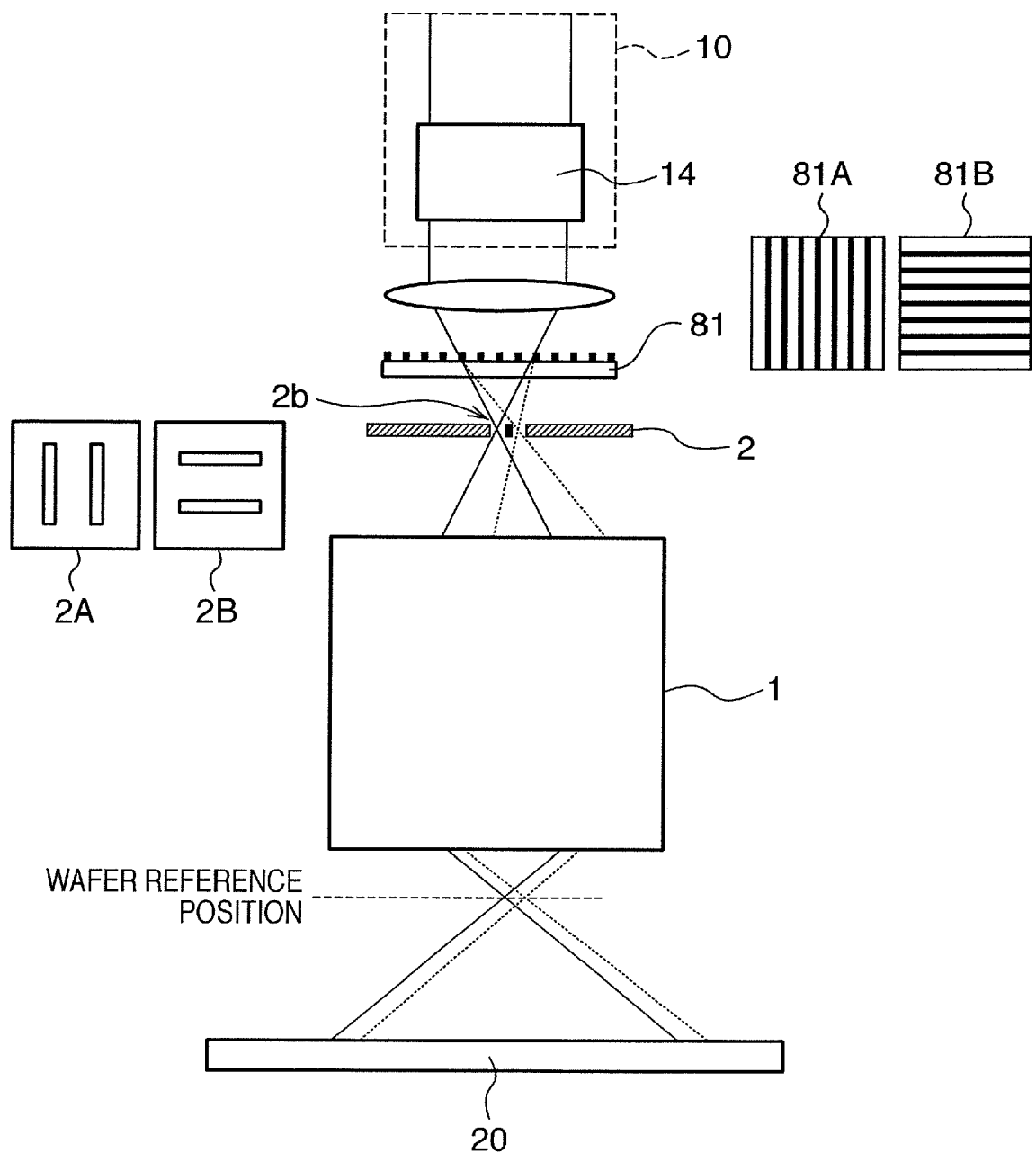
FIG. 8 is a view showing the schematic arrangement of an exposure apparatus according to a fifth embodiment of the present invention.

Although FIG. 8 shows an arrangement in which the slits generate ideal wavefronts, the same effect can be obtained with a pinhole pattern, in the same manner as in the other embodiments.

In this embodiment, each incident polarized light beam must be measured twice with the horizontal slit and the vertical slit. The same number of times of measurement is also required with a pinhole. Thus, from the viewpoint of light quantity, it is desirable to use slits.

Actual dimensions, such as the pitch of the diffraction grating, the slit size, the pinhole, and the like, can be optimized in accordance with the wavefront to be measured, the medium, and the like.

The number of directions of polarized light beams, which enter the projection optics 1, is not limited to four. As described in the first embodiment, if polarized light beams in at least three directions are used, non-polarization aberration and polarization aberration can be measured simultaneously. The polarizing direction can be selected arbitrarily.

Although the third, fourth, and fifth embodiments have described examples of the lateral shearing interferometer, a lateral shearing interferometer is available in various other arrangements.

The present invention is aimed at being capable of measuring non-polarization aberration and polarization aberration simultaneously by using at least three polarized light beams. Hence, the present invention can be adapted to various types of interference methods.

Sixth Embodiment

An exposure apparatus according to the sixth embodiment of the present invention will be described with reference to FIG. 9.

The sixth embodiment of the present invention provides an arrangement of an exposure apparatus having a function of measuring non-polarization aberration and polarization aberration (retardation and azimuth), which are the optical characteristics of projection optics, using a point diffraction interferometer (PDI). Since this point diffraction interferometer is a common path interferometer, its optical path and arrangement are simple and hardly affected by the vibration of the exposure apparatus. An illumination system controller 12, projection system controller 16, and processor 18 are identical to their equivalents in the first embodiment.

In the sixth embodiment of the present invention, when measuring the wavefront of the projection optics 1, a measuring reticle 2, having a pinhole 2a, is arranged at a reticle position, and a diffraction grating 91 is arranged between the measurement reticle 2 and projection optics 1. A wafer-side measurement pattern 92 having a pinhole 92a and window 92b are arranged near a wafer reference position.

The direction of the grating of the diffraction grating 91 and the direction of arranging the pinhole 92a and window 92b of the measurement pattern 92 must coincide with each other.

First, the diffraction grating 91 and measurement pattern 92 are arranged n the directions respectively indicated by reference numeral 91A and 92A, and measurement is performed. The pinhole 2a of the measurement reticle 2 changes light from an illumination system 10 into an ideal wavefront free from the aberration of the illumination system. The diffraction grating 91 splits the ideal wavefront into two. The two wavefronts enter the projection optics 1 as slightly shifted wavefronts. The two wavefronts change in accordance with the wavefront aberration information on the projection optics 1. Of the two wavefronts, one is transmitted through the pinhole 92a of the measurement pattern 92 to form an ideal wavefront again, and the other wavefront is transmitted through the large-opening window 92b. The large-opening window 92b transmits the wavefront directly, so that a wavefront having the aberration information on the projection optics 1 can be obtained. In this manner, interference fringes can be obtained on the image sensing surface of the image sensor 20 from the two wavefronts, i.e., the ideal wavefront from the pinhole 92a and the wavefront having the aberration information on the projection optics 1.

Subsequently, the diffraction grating 91 and measurement pattern 92 are rotated through 90°, so that they are arranged in directions indicated by reference numerals 91B and 92B, respectively. Then, similar measurement is performed. Synthesis of the two wavefronts can provide wavefront information representing a change in aberration of the projection optics.

Since the same measurement is performed using the diffraction grating 91 and measurement pattern 92, which are rotated through 90°, the wavefronts in two perpendicular directions can be measured. Synthesis of the two pieces of waveform information can provide wavefront information representing a change in aberration of the projection optics 1.

With such a PDI interferometer, in the same manner as in the first embodiment, a polarization controller 14 of the illumination system 10 sequentially generates four different linearly polarized light beams, i.e., a linear horizontally polarized light beam, a linear vertically polarized light beam, a linear +45° polarized light beam, and a linear −45° polarized light beam, which enter the projection optics 1. The four different polarized light beams sequentially form interference fringes, so that four pieces of wavefront information can be obtained. The non-polarization aberration and polarization aberration (retardation and azimuth) of the projection optics 1 can be calculated on the basis of these pieces of wavefront information in the same manner as in the first embodiment. As the slits are formed in two directions, the four incident polarized light beams must be measured in the two slit directions, leading to a total of eight measurements.

Actual dimensions, such as the pitch of the diffraction grating, the slit size, the pinhole, and the like, can be optimized in accordance with the wavefront to be measured, the medium, and the like.

The number of directions of polarized light beams to enter the projection optics 1 is not limited to four. As described in the first embodiment, if polarized light beams in at least three directions are used, non-polarization aberration and polarization aberration can be measured simultaneously. The polarizing direction can be selected arbitrarily.

In other words, if measuring at least three incident polarized light beams in two slit directions, thus performing measurement a total of six times, non-polarization aberration and polarization aberration can be measured simultaneously.

Seventh Embodiment

Figure 9:
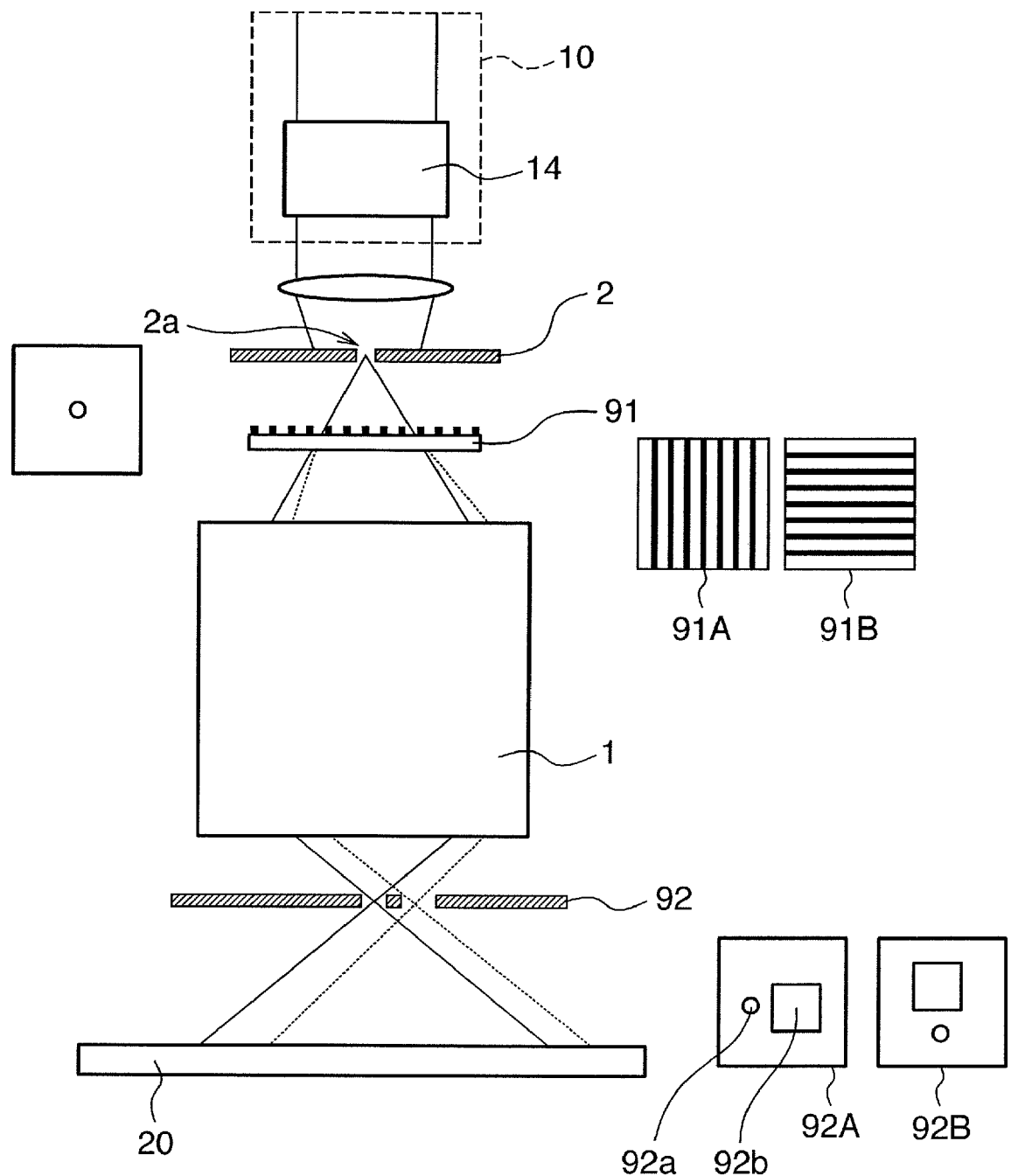
FIG. 9 is a view showing the schematic arrangement of an exposure apparatus according to a sixth embodiment of the present invention.

FIG. 10 is a view showing an arrangement of an exposure apparatus in which a line diffraction interferometer (LDI) replaces the PDI interferometer in FIG. 9. The pinhole 92a of the measurement pattern 92 (92A, 92B) in FIG. 9 is changed to a slit 110a in a measurement pattern 101 (101A, 101B) in FIG. 10. The patterns to be used in the LDI interferometer are formed in two directions. Thus, although the number of measurements is the same as that of the PDI interference, since the split replaces the pinhole, the light quantity can be increased.

In the same manner as in the fifth embodiment, when the transmission characteristics of the linearly polarized light beams that differ depending on the slit shape become a problem, it is preferable to form the slit from a pinhole array, as in FIG. 16B.

In the line diffraction interferometer, if measuring at least three incident polarized light beams in two slit directions, thus performing measurement a total of six times, non-polarization aberration and polarization aberration can be measured simultaneously.

Eighth Embodiment

An exposure apparatus according to the eighth embodiment of the present invention will be described with reference to FIGS. 11, 12, 13, and 14.

The eighth embodiment of the present invention provide an arrangement comprising a collimator lens in an exposure apparatus which measures non-polarization aberration and polarization aberration (retardation and azimuth), which are the optical characteristics of the projection optics. Particularly, the eighth embodiment of the present invention provides an arrangement of an exposure apparatus in which a collimator lens collimates a beam transmitted through the projection optics into parallel light, and a phase shifter and a polarizer can be arranged between the projection optics and an image sensor. This embodiment can be applied to a common path interferometer as described in the first to seventh embodiment. An illumination system controller 12, a projection system controller 16, and a processor 18 are identical to their equivalents in the first embodiment.

Figure 11:
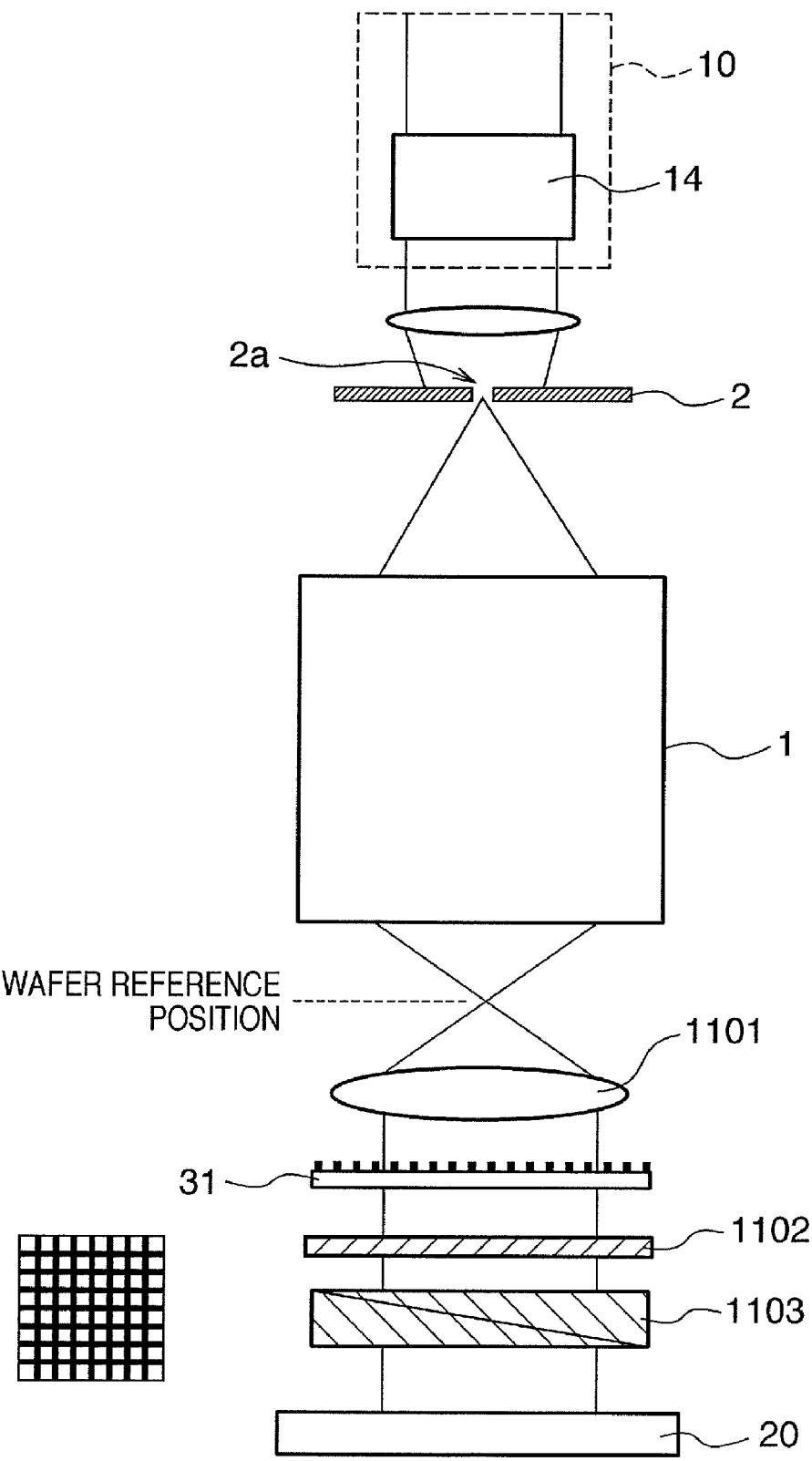
FIG. 11 is a view showing the schematic arrangement of an exposure apparatus according to an eighth embodiment of the present invention.
Figure 12:
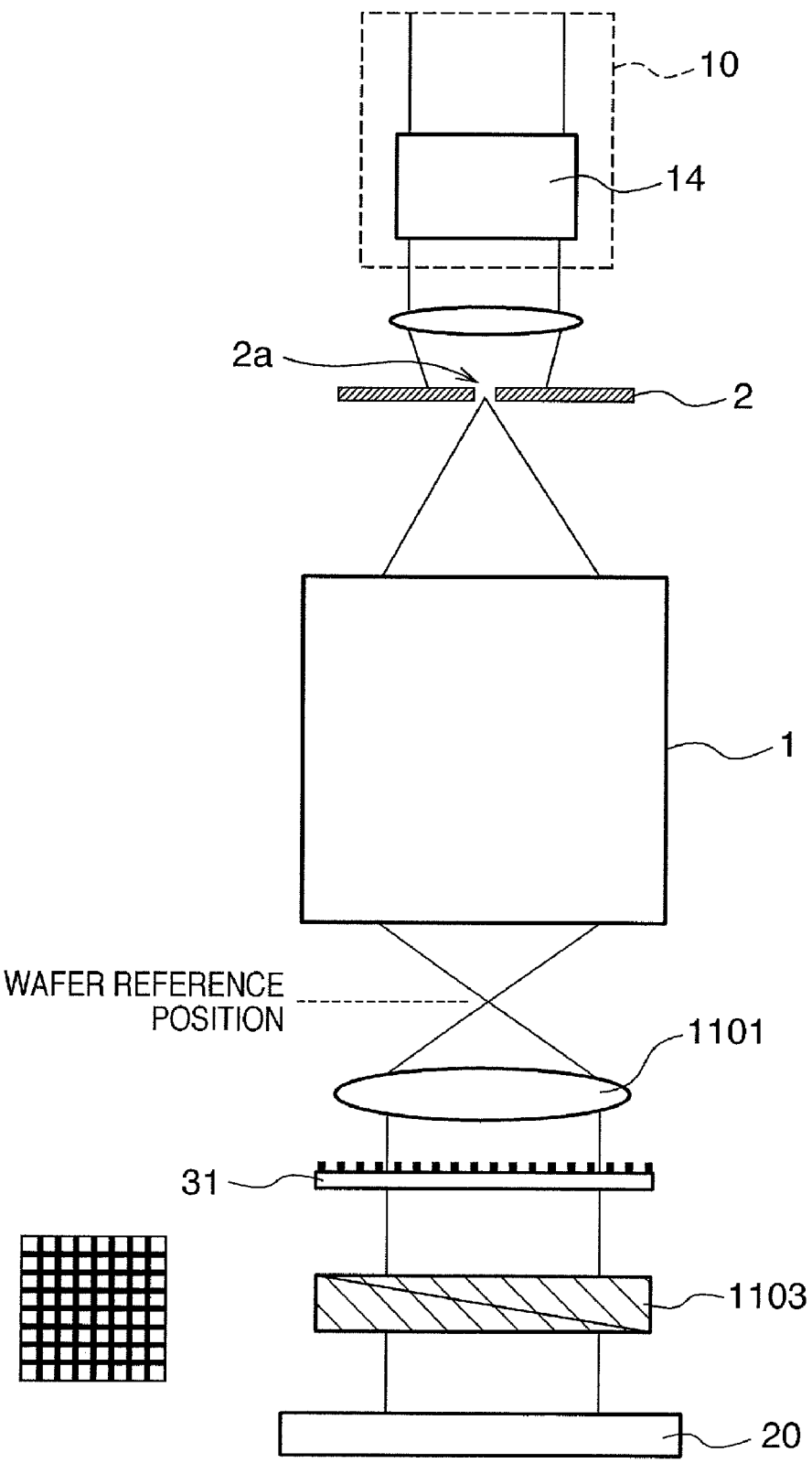
FIG. 12 is a view showing another schematic arrangement of an exposure apparatus according to the eighth embodiment of the present invention.

As an example of the interferometer, each of FIGS. 11 and 12 shows a lateral shearing interferometer which employs a diffraction grating.

Figure 4:
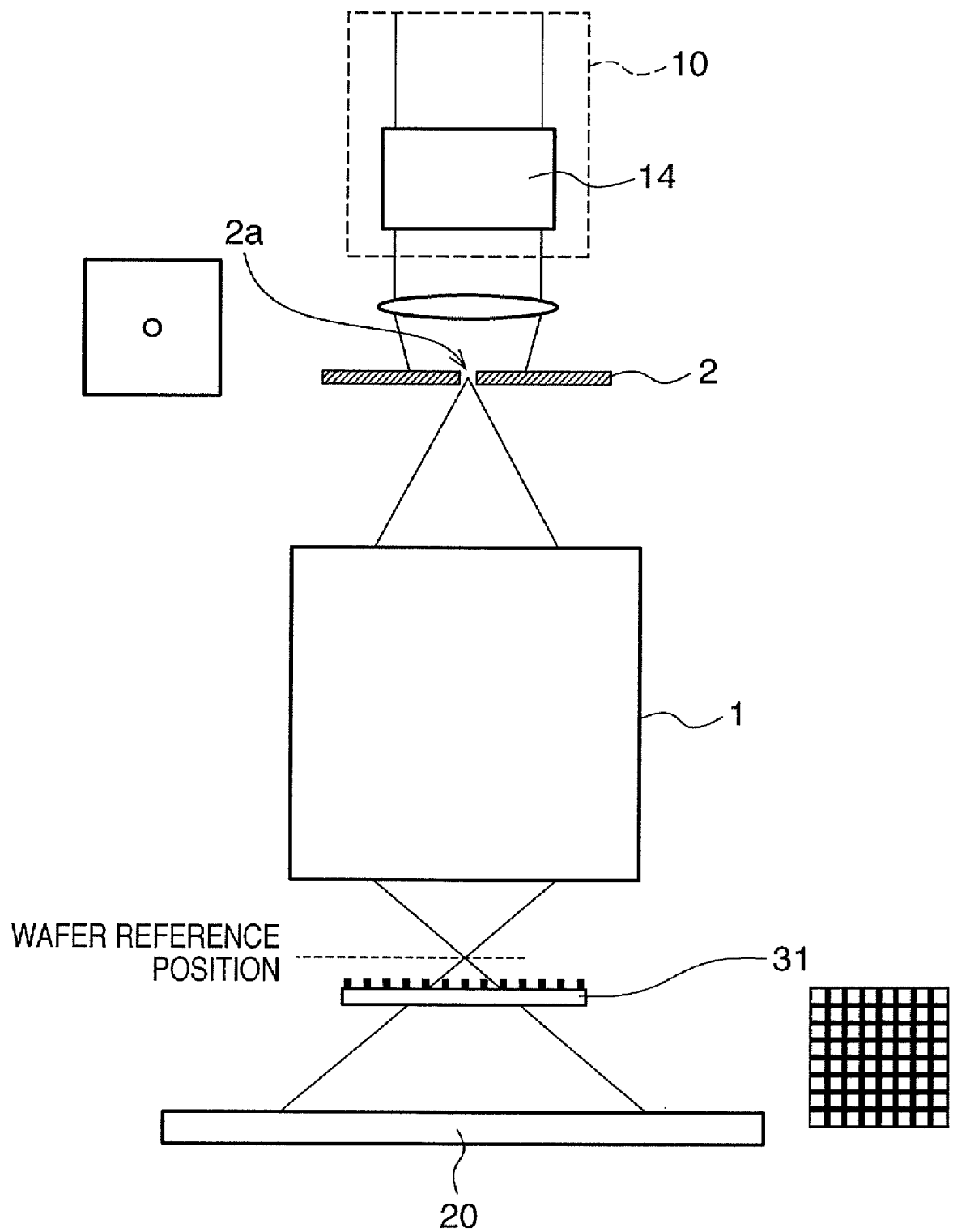
FIG. 4 is a view showing another schematic arrangement of the exposure apparatus according to the third embodiment of the present invention.

FIG. 11 is a view showing an application of the third embodiment shown in FIG. 4. Between the projection optics 1 and image sensor 20, a collimator lens 1101, diffraction grating 31, phase shifter 1102, and polarizer 1103 are arranged in that order from the projection optics 1 side.

FIG. 12 is a view showing an application in which the phase shifter 1102 is eliminated from the arrangement of FIG. 11. Between the projection optics 1 and image sensor 20, the collimator lens 1101, diffracting grating 31, and polarizer 1103 are arranged in that order from the projection optics 1 side.

The collimator lens 1101 collimates a beam transmitted through the projection optics 1 to almost parallel light. The diffraction grating 31 splits the wavefront of the almost parallel light. The split wavefronts are transmitted through the phase shifter 1102 (in the example of FIG. 11) and polarizer 1103. Interference fringes formed by the wavefronts transmitted through the polarizer 1103 are observed by the image sensor 20.

In this manner, if a phase shifter and a polarizer can be arranged, the degrees of freedom of measurement increase. As the polarizer can be arranged, only the component that passes along the axis of the polarizer needs to be measured separately.

If the polarization aberration is small, even when a phase shifter and/or a polarizer is arranged, non-polarization aberration and polarization aberration can be calculated by using interference fringes measured using at least three incident polarized light beams, (e.g., a horizontally polarized incident light beam, a vertically polarized incident light beam, and a +45° polarized light beam). To calculate the polarization aberration accurately, measurement must be performed while rotating the polarizer.

When using the polarizer, the aberration of the polarizer only in the direction of the transmission axis is measured. To perform measurement accurately, a total of six frames of interference fringes may be measured by using at least three incident polarized light beams (e.g., a horizontally placed incident light beam, a vertically polarized incident light beam, and a +45° polarized incident light beam), and rotating the polarizer (through 0°, 90°) for each incident polarized light beam.

Naturally, measurement may be performed for eight frames. Namely, four different incident polarized light beams (a horizontally polarized light beam, a vertically polarized light beam, and ±45° polarized light beams) may be used, and the polarizer may be rotated (through 0°, 90°) for each incident polarized light beam. In this case, the fact may be utilized that, e.g., the wavefront measured by a horizontally polarized incident light beam and the polarizer at 0°, and the wavefront measured by a vertically polarized incident light beam and the polarizer at 90° become equal to each other. Then, of the eight frames of measured wavefronts, if wavefronts are present that are measured with combinations of conditions, i.e., a horizontally polarized light beam and the polarizer at 0°, a vertically polarized light beam and the polarizer at 90°, a +45° polarized light beam and the polarizer at 0°, and a −45° polarized light beam and the polarizer at 90°, then non-polarization aberration and polarization aberration can be obtained.

Non-polarization aberration and polarization aberration can also be obtained from wavefronts that are measured with four combinations of the conditions, i.e., a +45° polarized light beam and the polarizer at 0, a +45° polarized light beam and the polarizer at 90°, a −45° polarized light beam and the polarizer at 0°, and a −45 polarized light beam and the polarizer at 90°.

In this manner, non-polarization aberration and polarization aberration can be calculated from at least four wavefronts that are measured using at least two incident polarized light beams and rotating the polarizer.

In the above description, the angles of the polarizer are 0° and 90°. However, the angle of the polarizer is not limited to them. Any two angles that are perpendicular to each other will do.

The angle of the incident linearly polarized light beam may be determined in accordance with the angle of the polarizer and the light quantity. When rotating the polarizer through 0° and 90° in the same manner as in this embodiment, the angles of the incident linearly polarized light beams may be 0° and 90°, which are the same as the angles of the polarizer, or linearly polarized light beams at angles (preferably, +45°) different from those of the polarizer may be used. Preferable conditions will be described hereafter.

For example, when the polarizer is at 0° and the incident polarized light beam is horizontal (parallel nicol), the polarizer transmits most components of the light. Thus, the light quantity is large, enabling accurate measurement. If the polarizer is rotated through 90° without changing the incident polarized light beam, the angle of the incident polarized light beam and that of the polarizer are perpendicular (crossed nicol), so that the light quantity decreases greatly. This is because only light leaking in a direction perpendicular to the axis of the incident linearly polarized light beam is transmitted due to the birefringence of the detection target object. If the light quantity is small, accurate measurement cannot be performed. In this manner, a condition (crossed nicol) in which the angle of the polarizer and that of the incident linearly polarized light beam are perpendicular is not suitable for measurement.

According to another example, when the polarizer is at 0° and the incident polarized light beam is at +45°, and even if the polarizer is rotated through 90° without changing the incident polarized light beam, the light quantity hardly changes. Similarly, when the polarizer is at 0° and the incident polarized light beam is at −45°, even if the polarizer is rotated through 90° without changing the incident polarized light beam, the light quantity hardly changes. The light quantities of the above four cases are almost equal. Under these measurement conditions, accurate measurement is possible.

Hence, from the viewpoint of the light quantity, the angle of the incident polarized light beam should either be equal to the angle of the polarizer, or be different from the angle of the polarizer (preferably, +45°). It is desirable not to use an incident polarized light beam, which is perpendicular to the angle of the polarizer.

When the number of incident polarized light beams is two, and four measurements are to be performed by rotating the polarizer, it may be desirable to use incident polarized light beams which are shifted (preferably, by +45°) from the angle of the transmission axis of the polarizer.

Furthermore, regarding the characteristics of the phase shifter and polarizer, if a system that performs calibration is separately provided, wavefront information can be obtained more accurately.

To separate a change in wavefront caused by the aberration of the projection optics from a change in wavefront caused by the phase shifter and polarizer, a pinhole is arranged at the wafer reference position, and a wavefront which is influenced by only the phase shifter and polarizer, is measured, as shown in the third embodiment. This is because, when arranging the pinhole at the wafer reference position, the influence of the aberration of the illumination system and that of the projection optics are eliminated, and only the aberration from the phase shifter and polarizer can be measured. By eliminating the measured aberration information on the phase shifter and polarizer from the separately measured wavefront, the aberration information on the projection optics can be identified more accurately.

Both FIGS. 11 and 12 show applications, in each of which the diffraction grating is arranged before the phase shifter or polarizer. The same effect can also be obtained by arranging the diffraction grating after the phase shifter or polarizer. The polarizer need not be arranged, and only the phase shifter may arranged, or neither the phase shifter nor the polarizer need be arranged. When neither the phase shifter nor the polarizer is arranged, an arrangement, which is the same as that of the third embodiment, can be obtained.

As described above, in the interferometer comprising the phase shifter and polarizer, when using at least two different incident polarized light beams and, also, utilizing information on rotation of the polarizer, non-polarization aberration and polarization aberration can be measured in the same manner as in the other embodiments.

Figure 13:
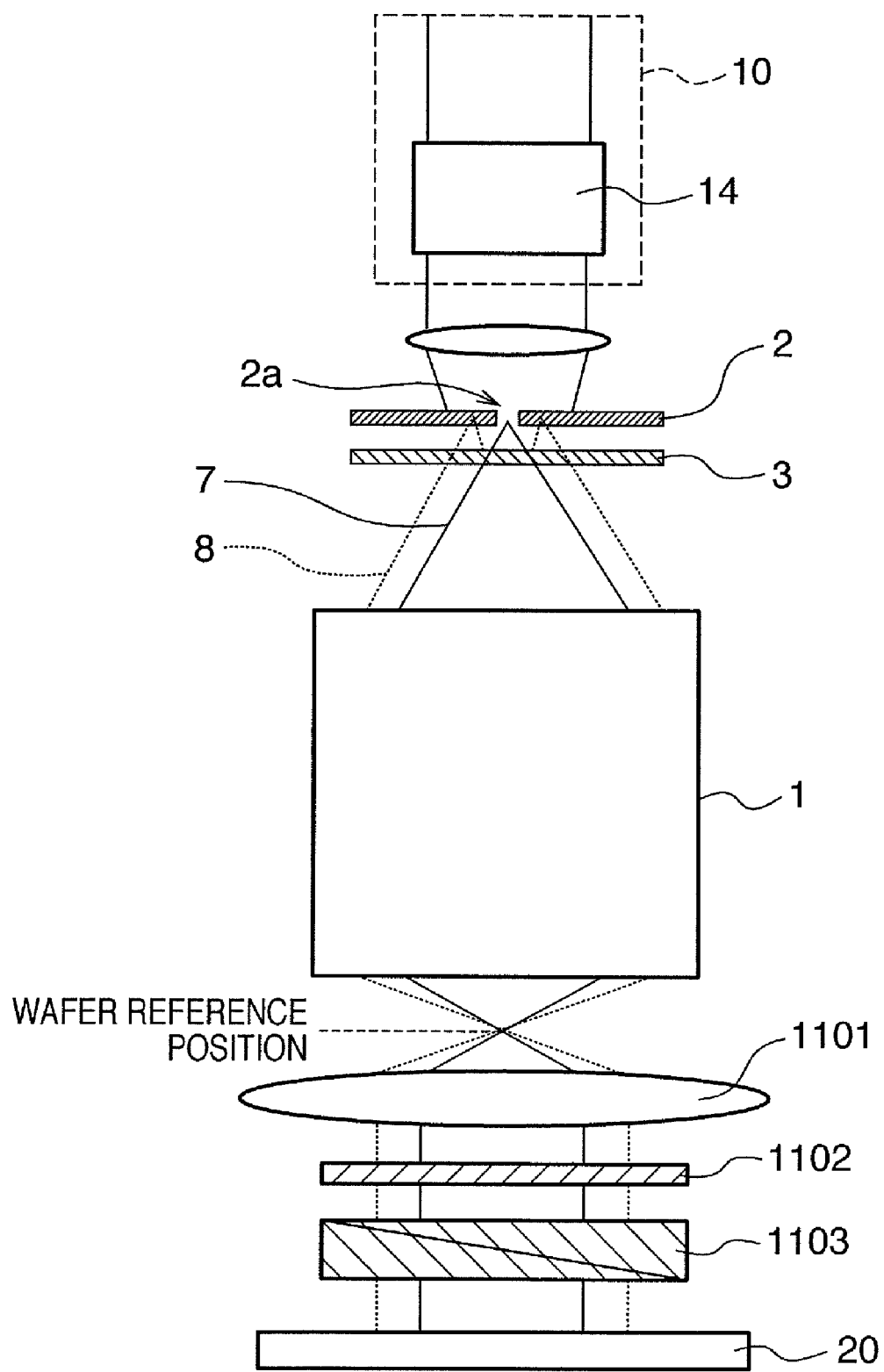
FIG. 13 is a view showing another schematic arrangement of an exposure apparatus according to the eighth embodiment of the present invention.

As another interferometer, FIG. 13 shows an example of a radial shearing interferometer, which uses a measurement substrate. This is an application of the embodiment shown in FIG. 1. Between the projection optics and image sensor, a collimator lens, a phase shifter, and a polarizer are arranged in that order. As described above, the polarizer need not be present, and only the phase shifter may be arranged, or neither the phase shifter nor the polarizer need be arranged. When neither the phase shifter nor the polarizer is arranged, an arrangement, which is the same as that of the first embodiment, can be obtained.

Figure 14:
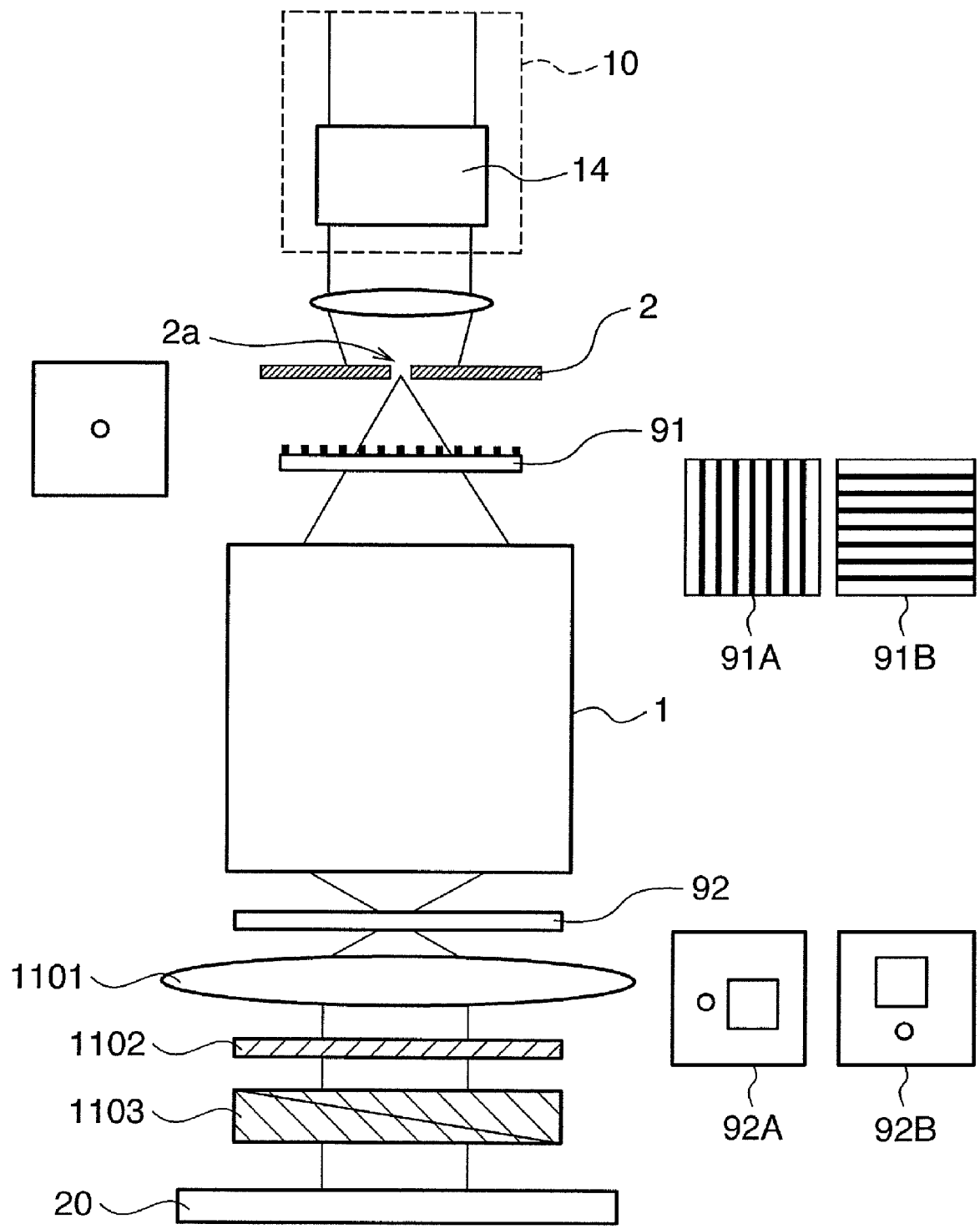
FIG. 14 is a view showing yet another schematic arrangement of an exposure apparatus according to the eighth embodiment of the present invention.

As yet another interferometer, FIG. 14 shows an example of a PDI interferometer, which performs measurement by forming an ideal wavefront with a pinhole. This is an application of the sixth embodiment shown in FIG. 9. Between the projection optics 1 and image sensor 20, a collimator lens 1101, a phase shifter 1102, and a polarizer 1103 are arranged, in this order, from the projection optics 1 side. Only one of the phase shifter and polarizer may be arranged, or neither the phase shifter nor the polarizer need be arranged. When neither the phase shifter nor the polarizer is arranged, an arrangement which is the same as that of the sixth embodiment can be obtained.

In any case, an interferometer comprising a phase shifter and polarizer can calculate non-polarization aberration and polarization aberration from at least four wavefronts, which are obtained using at least two incident polarized light beams and rotating the polarizer, in the same manner as in the other embodiments.

Ninth Embodiment

Figure 17:
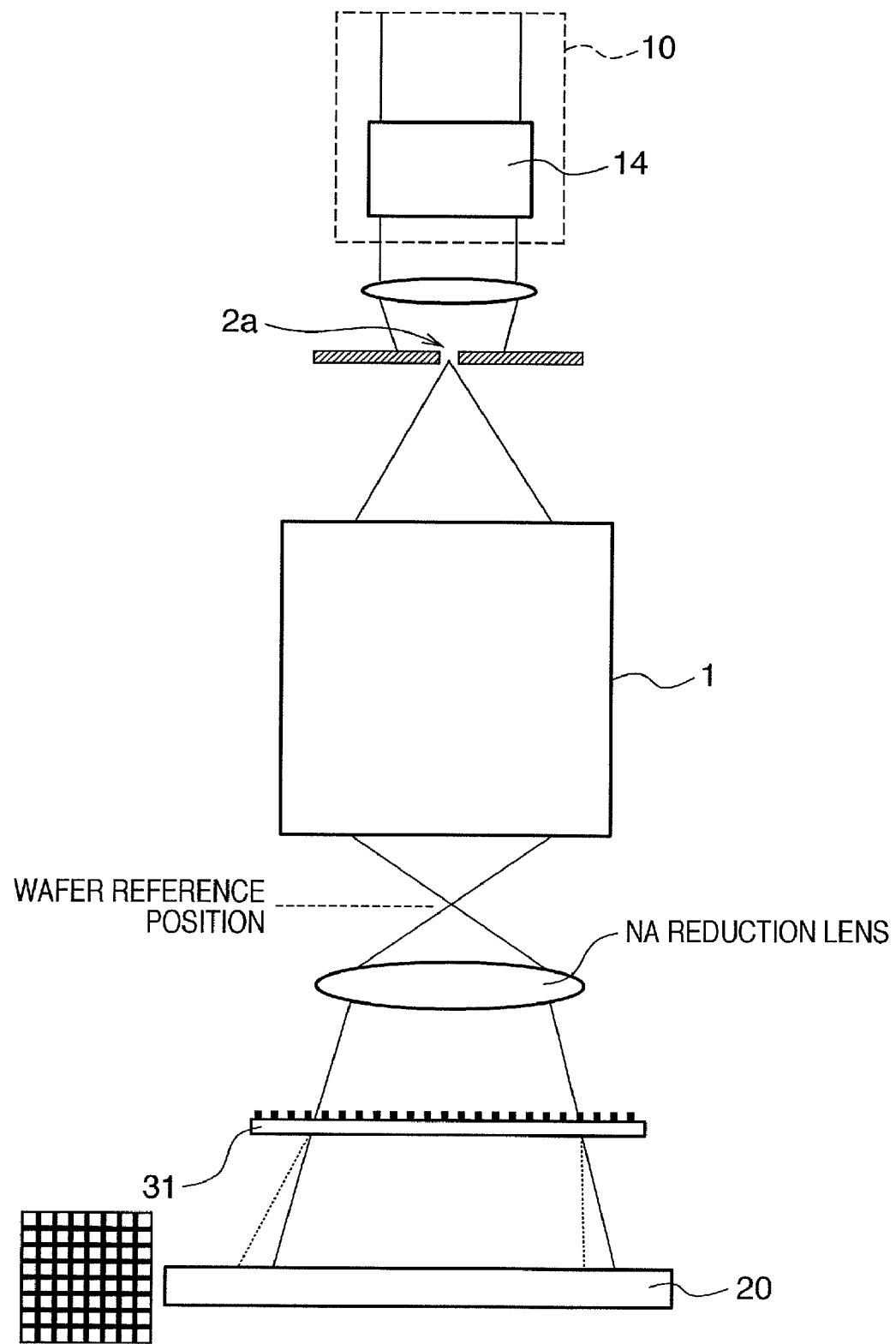
FIG. 17 is a view showing the schematic arrangement of an exposure apparatus according to a ninth embodiment of the present invention.

An exposure apparatus according to the ninth embodiment of the present invention will be described with reference to FIG. 17. The ninth embodiment is similar to the third embodiment shown in FIG. 4, but is different from the third embodiment in that an NA reduction lens, serving as an NA decreasing means, is arranged between the wafer reference position and the diffraction grating.

As the device feature size shrinks, the numerical aperture (NA) of the projection optics of an exposure apparatus increases more and more. When the NA increases, when a diffraction grating transmits light, a beam from a portion around the pupil may become evanescent light. Even if the diffraction grating can diffract the light, since the diffraction angle is large, the pitch of the interference fringes changes significantly between the center and the periphery. When the pitch of the interference fringes changes in this manner, the wavefront of the entire pupil of the projection optics must be measured by splitting. In other words, the center of the interference fringes and the periphery of the interference fringes must be measured separately.

In order to avoid this phenomenon, an NA reduction lens, which decreases the NA of light transmitted through the projection optics 1, may be inserted between the wafer reference position and the diffraction grating to decrease the numerical aperture (NA) of the projection optics. And, by doing so, the pitch of the interference fringes changes gradually at the center and the periphery of the interference fringes. This enables measurement of the whole interference fringes at once.

The characteristic features of this embodiment resides in employment of the NA reduction lens, which decreases the NA of the beam. Ideally, not an NA reduction lens, but a collimator lens, is desirably arranged to form complete parallel light. When the numerical aperture is large, however, the number of collimator lenses increases. Then, a problem may arise in the arrangement. For this reason, a lens is used which decreases the numerical aperture (NA) to such a degree that the whole of the interference fringes can be made more simple and compact than the collimator lens.

As a criterion with which the whole of the interference fringes can be measured at once, the NA of the NA decreasing lens is desirably 0.6 or less.

The measuring method is the same as that described in the third embodiment. Non-polarization aberration and polarization aberration can be measured from at least three different interference fringes, which are measured using at least three different incident polarized light beams.

Various other arrangements can be used to decrease the NA other than an NA reduction lens. For example, the diffraction grating may be dipped in a liquid having a large refractive index.

Tenth Embodiment

Exposure apparatuses according to the tenth embodiment of the present invention will be described with reference to FIGS. 18, 19, 20, and 21. The first to ninth embodiments show systems, in each of which, an image sensor is arranged on the wafer side of the projection optics, and interference fringes are measured on the wafer side of the projection optics. The tenth embodiment shows systems in which the image sensor is arranged on the reticle side of the projection optics and the interference fringes are measured on the reticle side of the projection optics.

Figure 18:
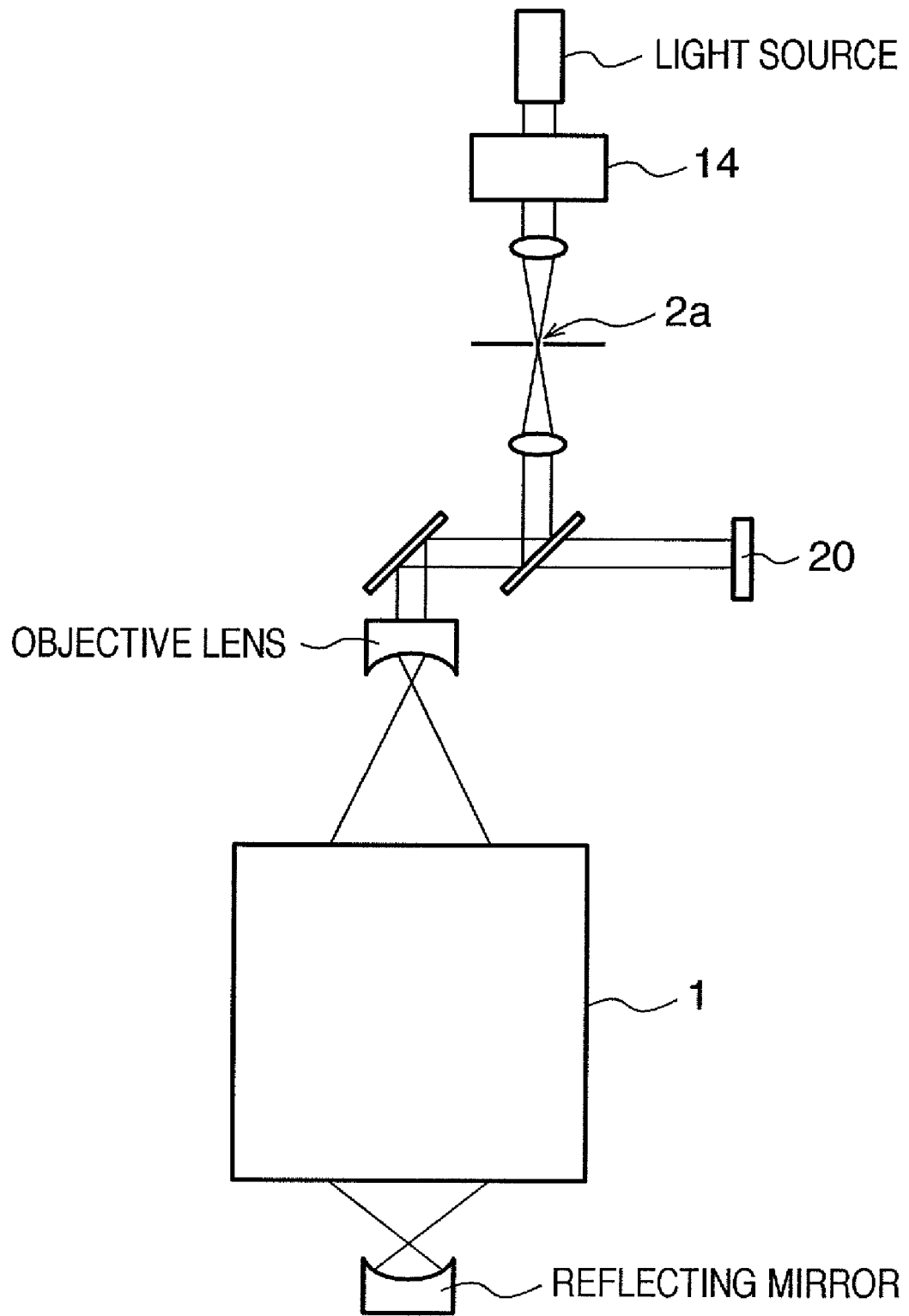
FIG. 18 is a view showing the schematic arrangement of an exposure apparatus according to a tenth embodiment of the present invention.
Figure 19:
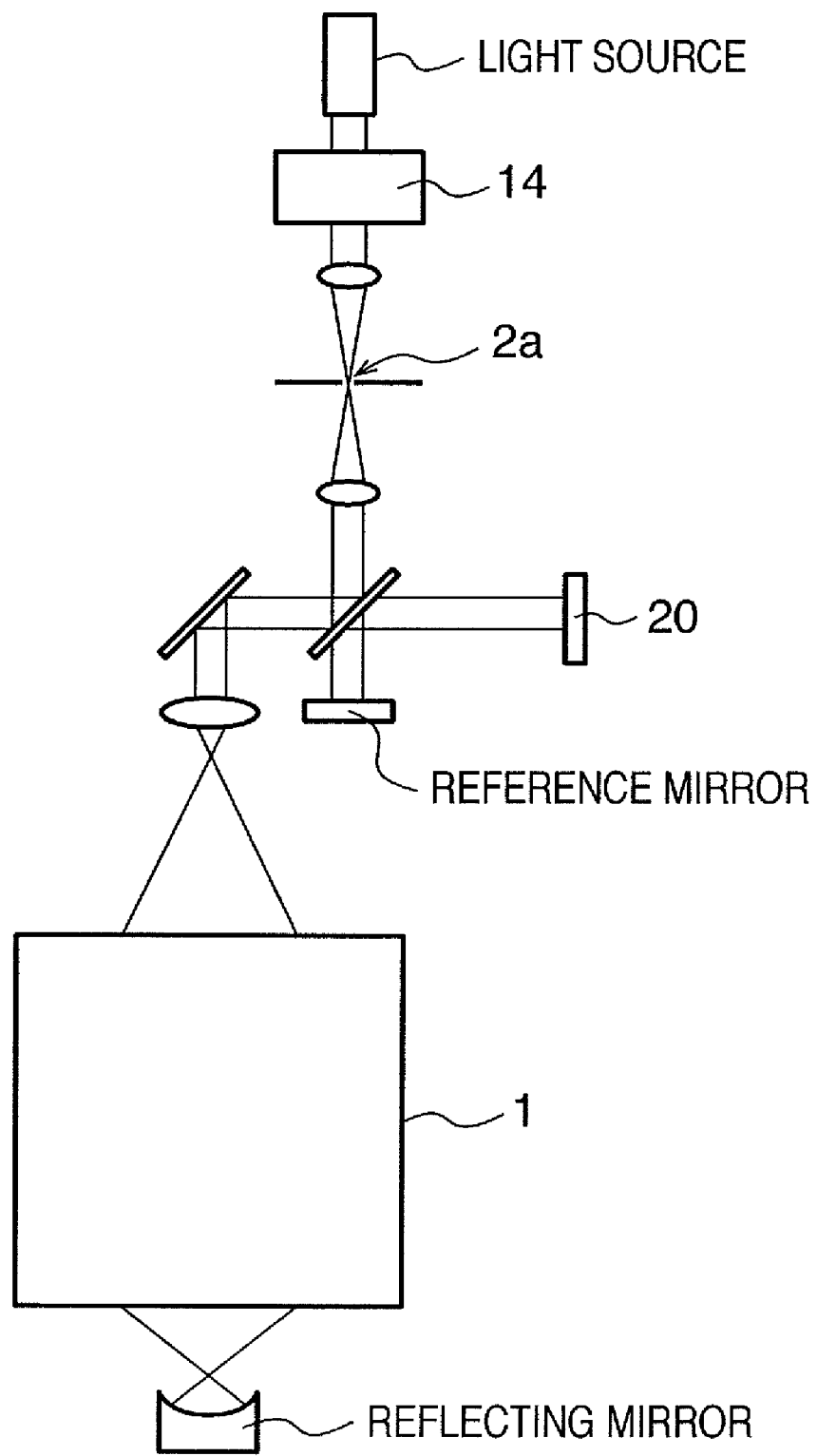
FIG. 19 is a view showing the schematic arrangement of an exposure apparatus according to the tenth embodiment of the present invention.

An exposure light has a very short coherence length, if measuring a wavefront using the exposure light, only a common path interferometer can be used. When mounting a light source dedicated to measurement in an exposure apparatus independently of an exposure light source, the arrangement of a Fizeau interferometer, as shown in FIG. 18, or a Twyman-Green interferometer, shown in FIG. 19, can be employed.

Figure 20:
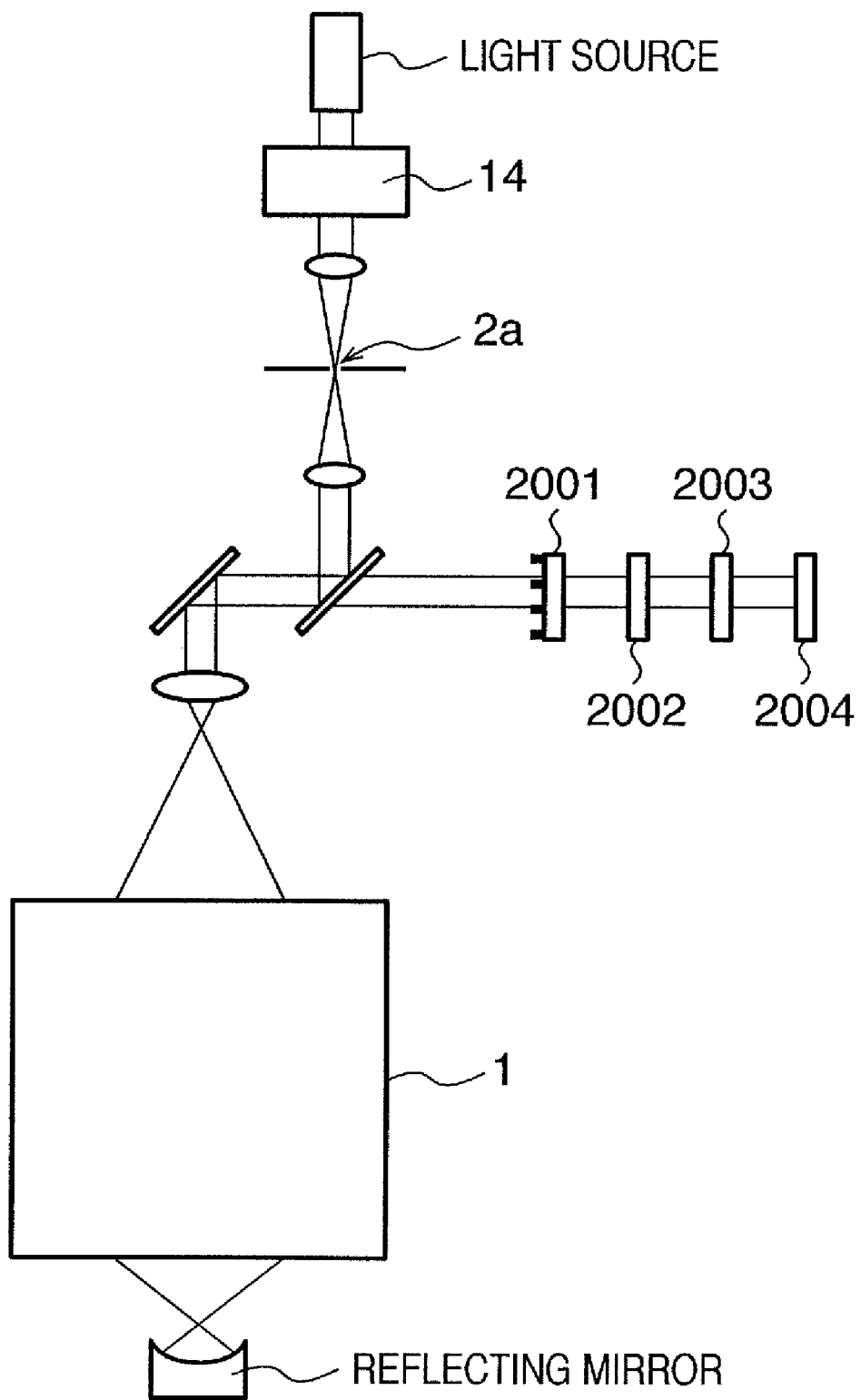
FIG. 20 is a view showing the schematic arrangement of an exposure apparatus according to the tenth embodiment of the present invention.
Figure 21:
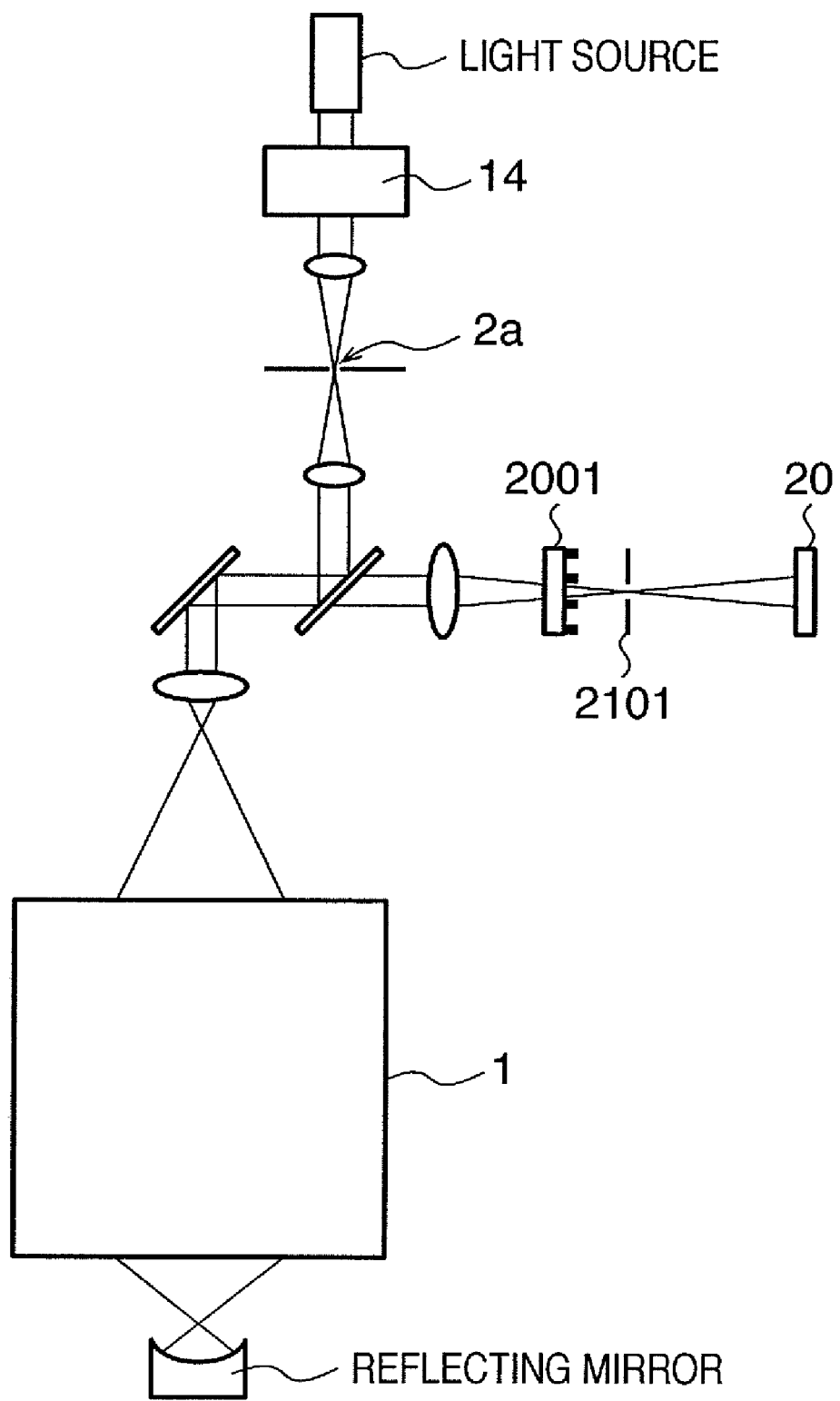
FIG. 21 is a view showing the schematic arrangement of an exposure apparatus according to the tenth embodiment of the present invention.

When using the exposure light as measurement light, a shearing interferometer can be formed as shown in, e.g., FIGS. 20 and 21, which measures a wavefront by splitting the wavefront with a diffracting grating. The basic arrangement of the tenth embodiment, the arrangement of the third arrangement is applied to the reticle side. In FIG. 21, reference numeral 2101 denotes an order selection window; and reference numeral 2001, a diffraction grating. A light source dedicated to measurement may be employed in the arrangement of each of FIGS. 20 and 21, as a matter of course.

Measurement may be possible without a phase shifter or polarizer. If the exposure light can be collimated to parallel light, as in FIG. 20, a phase shifter or a polarizer can be arranged. If an order selection window, which condenses light temporarily and transmits only a desired-order polarized light beam, is arranged as shown in FIG. 21, only a necessary-order beam can be extracted efficiently. In this case, interference fringes having a high contrast can be obtained, so that accurate measurement can be performed. In the same manner as in FIG. 20, the light may be collimated and optical elements, such as a phase shifter or a polarizer, may be arranged immediately before an image sensor. As the diffraction grating to be used in this case, the amplitude grating or phase grating described in the third embodiment is employed.

According to this embodiment, a reflection wavefront, obtained such that light entering the projection optics from the reticle side is reflected by the reflecting mirror, is to be measured. As the beam reciprocates through the projection optics, being reflected by a reflecting mirror on the wafer side of the projection optics, the amount of aberration is doubled. This facilitates detection when the amount of aberration is small. As the reticle side originally has a small numerical aperture, collimation becomes easy.

In measurement on the reticle side, the measurement conditions are the same as in the case of the wafer side described in the first to ninth embodiments. A polarization controller controls light, emitted by the light source of the exposure apparatus or from a light source dedicated for measurement, to a desired polarized light beam. By using a plurality of pieces of different information on the incident polarized light beams, the optical characteristics of the projection optics are calculated.

More specifically, if no polarizer is arranged in the optical path, non-polarization aberration and polarization aberration are calculated from wavefronts measured using at least three incident polarized light beams.

If a rotatable polarizer is arranged on the optical path, non-polarization aberration and polarization aberration are calculated from at least four wavefronts measured using at least two incident polarized light beams and by rotating the polarizer.

So far, the embodiments of the present invention have been described, which correspond to the arrangements of the interferometer. The present invention can also be applied to various types of interference methods.

If the projection optics are rotated in place of performing measurement using a plurality of incident polarized light beams, the same effect can be obtained.

When the number of measurements increases, i.e., the number of incident polarized light beams and the rotation of the polarizer, more accurate measurement can be performed. Optimal conditions may be selected in accordance with the relationship between the accuracy and measurement time.

Application Example

An exemplary device manufacturing method, which utilizes the exposure apparatus described above, will be described.

FIG. 23 shows a method of manufacturing a semiconductor device (e.g., a semiconductor chip, such as an IC or an LSI, a liquid crystal panel, or a CCD). In step 1 (circuit design), the circuit of a semiconductor device is designed. In step 2 (reticle fabrication, a reticle having the designed circuit pattern is fabricated. In step 3 (wafer manufacture), a wafer is manufactured using a material such as silicon. In step 4 (wafer process), called a preprocess, an actual circuit is formed on the wafer in accordance with lithography using the prepared reticle and wafer. In the next step (assembly), called a postprocess, a chip is formed from the wafer formed in step 4. This step includes processes, such as assembly (dicing and bonding) and packaging (chip encapsulation). In step 6, (inspection), inspections, including an operation check test and a durability test, of the semiconductor device formed in step 5, are performed. A semiconductor device is finished with these processes and shipped (step 7).

FIG. 24 shows the detailed flowchart of the wafer process. In step 11 (oxidation), the surface of the wafer is oxidized. In step 12, an insulating film is formed on the wafer surface. In step 13 (electrode formation), an electrode is formed on the wafer by deposition. In step 14 (ion implantation), ions are implanted into the wafer. In step 15 (resist process), a resist (photosensitive agent) is applied to the wafer. In step 16 (exposure), the exposure apparatus described above exposes the wafer with the image of the circuit pattern of the reticle. In step 17 (development), the exposed wafer is developed. In step 18 (etching), portions other than the developed resist are etched. In step 19 (resist removal), any unnecessary resist remaining after etching is removed. By repeating these steps, a circuit pattern is formed on the wafer.

While the present invention has been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

What is claimed is:

1. An exposure apparatus including an illumination system which illuminates an original, and projection optics which project a pattern of the original illuminated by said illumination system onto a substrate, said apparatus comprising:

an interferometer which forms an interference pattern including aberration information on said projection optics using a polarized light beam emitted from said illumination system, wherein said interferometer is a common path interferometer in which two light beams forming an interference pattern pass along a path in said projection optics; and a processor which calculates optical characteristics of said projection optics on the basis of the interference pattern formed by said interferometer, wherein said illumination system includes a polarization controller which sequentially generates at least three different polarized light beams with respective polarization states different from each other, and wherein said processor separates first aberration and second aberration from wavefront aberration represented by the interference patterns sequentially formed by said interferometer using said at least three different polarized light beams, by calculating data of the interference patterns, the first aberration being aberration which does not change dependent on a polarization state of a polarized light beam entering said projection optics, and the second aberration being aberration which changes dependent on the polarization state of the polarized light beam entering said projection optics.

2. The apparatus according to claim 1, wherein said at least three different polarized light beams include a linearly polarized light beam.

3. The apparatus according to claim 1, wherein said at least three different polarized light beams include one of a group of two linearly polarized light beams with polarizing directions which are different from each other by 90° and a group of two circularly polarized light beams including a right circularly polarized light beam and a left circularly polarized light beam.

4. The apparatus according to claim 1, wherein said at least three different polarized light beams include three different linearly polarized light beams with polarizing directions which differ from each other by +45°.

5. The apparatus according to claim 1, wherein said at least three different polarized light beams include four different linearly polarized light beams with polarizing directions which are different from each other by +45°.

6. The apparatus according to claim 1, wherein said common path interferometer comprises one of the group consisting of a radial shear interferometer (RSI), a lateral shearing interferometer (LSI), a point diffraction interferometer (PDI), a line diffraction interferometer (LDI), and a cross grating lateral shearing interferometer (CGLSI).

7. An exposure apparatus including an illumination system which illuminates an original and projection optics which project a pattern of the original illuminated by said illumination system onto a substrate, said apparatus comprising:

an interferometer which forms an interference pattern including aberration information on said projection optics using a polarized light beam emitted from said illumination system, wherein said interferometer is a common path interferometer in which two light beams forming an interference pattern pass along a path in said projection optics; and a processor which calculates optical characteristics of said projection optics on the basis of the interference pattern formed by said interferometer, wherein said illumination system includes a polarization controller which sequentially generates at least two different polarized light beams with polarization states different from each other, and said interferometer includes a polarizer which transmits light having a predetermined polarization transmitted through said projection optics, and wherein said processor rotates said polarizer and calculates the optical characteristics of said projection optics on the basis of at least four interference patterns sequentially formed by said interferometer.

8. The apparatus according to claim 7, wherein said polarizer is rotated between two rotation angles at ninety degrees to one another.

9. The apparatus according to claim 8, wherein said two rotation angles are not perpendicular to the angle of incidence of an incident polarized light beam.

10. The apparatus according to claim 8, wherein said polarizer is rotated between two rotation angles, one of which is a member of the group of angles that are equal to the angle of the incident polarized light beam, and the other rotation angle being a member of the group of two angles which are different from each other by ±45°.

11. The apparatus according to claim 1, wherein said interferometer comprises one of an amplitude grating and a phase grating.

12. The apparatus according to claim 1, further comprising an illumination system controller to adjust said illumination system, said illumination system being adjusted on the basis of non-polarization aberration and polarization aberration calculated by said processor.

13. The apparatus according to claim 1, further comprising a projection system controller to adjust said projection optics, said projection optics being adjusted on the basis of non-polarization aberration and polarization aberration calculated by said processor.

14. A method of manufacturing a device, said method comprising the steps of:

illuminating an original using an illumination system, the illumination system including a polarization controller that sequentially generates at least three different polarized light beams with respective polarization states different from each other, using a polarized light beam emitted from the illumination system;

projecting, using projection optics, a pattern of the original illuminated by the illumination system;

forming, using an interferometer, an interference pattern including aberration information on the, wherein the interferometer is a common path interferometer in which two light beams forming an interference pattern pass along a path in the projection optics;

calculating, using a processor, optical characteristics of the projection optics on the basis of the interference pattern formed by the interferometer;

separating, using the processor, first aberration and second aberration from wavefront aberration represented by the interference patterns sequentially formed by the interferometer using the at least three different polarized light beams, by calculating data of the interference patterns, the first aberration being aberration which does not change dependent on a polarization state of a polarized light beam entering the projection optics, and the second aberration being aberration which changes dependent on the polarization state of the polarized light beam entering the projection optics;

exposing, using the illumination system, a substrate, coated with a photosensitive agent, to a pattern on the original;

developing the substrate that has been exposed to the pattern, to produce a developed substrate; and processing the developed substrate to manufacture the device.

15. The method according to claim 14, further comprising rotating the polarizer between two rotational angles at ninety degrees to one another.

16. The method according to claim 15, wherein the two rotation angles are not perpendicular to the angle of incidence of an incident polarizer light beam.

17. The method according to claim 15, wherein the polarizer is rotated between two rotation angles, one of which is a member of the group of angles that are equal to the angle of the incident polarized light beam, and the other rotation angle being a member of the group of two angles which are different from each other by ±45°.

* * * * *